(12) United States Patent
Park et al.

(10) Patent No.: US 12,340,849 B2
(45) Date of Patent: Jun. 24, 2025

(54) MEMORY DEVICE FOR DETECTING FAIL CELL AND OPERATION METHOD THEREOF

(71) Applicant: Samsung Electronics Co., Ltd., Suwon-si (KR)

(72) Inventors: Jooyong Park, Suwon-si (KR); Wontaeck Jung, Suwon-si (KR); Nayeon Kim, Suwon-si (KR); Jiwon Seo, Suwon-si (KR); Seungyong Hyun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 145 days.

(21) Appl. No.: 17/982,550

(22) Filed: Nov. 8, 2022

(65) Prior Publication Data
US 2023/0148408 A1 May 11, 2023

(30) Foreign Application Priority Data

Nov. 11, 2021 (KR) ............... 10-2021-0155153
May 24, 2022 (KR) ............... 10-2022-0063678

(51) Int. Cl.
*G11C 16/34* (2006.01)
*G11C 16/08* (2006.01)

(52) U.S. Cl.
CPC ......... *G11C 16/3459* (2013.01); *G11C 16/08* (2013.01); *G11C 16/3468* (2013.01)

(58) Field of Classification Search
CPC . G11C 16/3459; G11C 16/08; G11C 16/3468; G11C 2211/5621; G11C 11/5628; G11C 16/0483; G11C 29/12; H10B 43/27
See application file for complete search history.

(56) References Cited

U.S. PATENT DOCUMENTS

| | | | |
|---|---|---|---|
| 6,907,497 B2 | 6/2005 | Hosono et al. | |
| 8,422,305 B2* | 4/2013 | Lee | G11C 16/0408 |
| | | | 365/185.14 |
| 8,891,304 B2 | 11/2014 | Nagashima | |
| 9,607,698 B2* | 3/2017 | Lee | G11C 16/3459 |
| 10,643,724 B2 | 5/2020 | Her et al. | |
| 10,783,974 B2* | 9/2020 | Kim | G11C 16/3495 |
| 10,839,928 B1* | 11/2020 | Yang | G11C 16/26 |
| 2012/0155180 A1* | 6/2012 | Kawamura | G11C 16/3413 |
| | | | 365/185.17 |
| 2017/0025176 A1* | 1/2017 | Lee | G11C 16/3459 |
| 2023/0148408 A1* | 5/2023 | Park | G11C 16/0483 |
| | | | 365/185.22 |

FOREIGN PATENT DOCUMENTS

KR 10-2011-0001071 A 1/2011

* cited by examiner

*Primary Examiner* — Khamdan N. Alrobaie
(74) *Attorney, Agent, or Firm* — Muir Patent Law, PLLC

(57) ABSTRACT

An operation method of a memory device for programming memory cells to a plurality of program states includes providing a series of program pulses to selected memory cells, performing a first verification operation of verifying a target program state among the plurality of program states, performing, when the first verification operation is passed, a second verification operation of detecting fail cells among the selected memory cells to determine if these memory cells have been overprogrammed. When the number of detected fail cells is greater than or equal to a reference value, the program operation may be terminated for that location and the data may be written to another location.

20 Claims, 20 Drawing Sheets

MEMORY DEVICE FOR DETECTING FAIL CELL AND OPERATION METHOD THEREOF

CROSS-REFERENCE TO RELATED APPLICATIONS

This application is based on and claims priority under 35 U.S.C. § 119 to Korean Patent Application Nos. 10-2021-0155153, filed on Nov. 11, 2021, and 10-2022-0063678, filed on May 24, 2022 in the Korean Intellectual Property Office, the disclosure of each of these applications being incorporated by reference herein in its entirety.

BACKGROUND

The inventive concept relates to a memory device, and more particularly, to a memory device for detecting a fail cell, and an operation method thereof.

The memory capacity of memory devices is increasing with the development of manufacturing technology. In particular, in order to improve the degree of integration of memory devices, a memory device having a three-dimensional structure has been studied. Advancements in technology for microfabrication of a memory device having a three-dimensional structure have led to an increase in the number of fail cells (defective memory cells). The increase in the number of fail cells makes it difficult to guarantee memory capacity. Accordingly, there is a need for a method of detecting and managing fail cells in a memory device.

SUMMARY

The inventive concept provides a memory device for detecting a fail cell during a program operation, and an operation method of the memory device.

According to some embodiments, a method of programming memory cells of a memory device to a plurality of program states comprises, for a target program state of the plurality of program states (a) selecting one or more of the memory cells to be programmed to the target program state; (b) applying one or more program pulses to the selected memory cells; (c) performing a first verification operation of verifying the selected memory cells as programmed to at least the target program state, the verified selected memory cells being identified as programmed-passed memory cells, the first verification operation comprising providing a first verify voltage to the selected memory cells; (d) after the first verification operation is passed for all of the selected memory cells, performing a second verification operation of detecting fail cells among the programmed-passed memory cells, the second verification operation comprising providing an over-bit verify voltage to the programmed-passed memory cells,; and (e) comparing a number of detected fail cells to a reference value to determine whether a program operation should be terminated, and wherein the over-bit verify voltage provided to the programmed-passed memory cells in the second verification operation comprises a verify voltage corresponding to a subsequent program state to the target program state.

According to some embodiments, a memory device may comprise a memory cell array including a plurality of memory cells configured to be programmed to have a corresponding program state among a plurality of program states, each program state being defined by a corresponding range of threshold voltages; a row decoder configured to provide a voltage to word lines of the plurality of memory cells; and a control logic circuit configured to control the row decoder, wherein the control logic circuit is further configured to control the row decoder to provide a program pulse to the plurality of memory cells, provide a first verify voltage to memory cells corresponding to a target program state among the plurality of program states to verify selected ones of the plurality of memory cells have been programmed to at least the target program state, and provide an over-bit verify voltage to the selected memory cells programmed to the target program state to detect fail cells, and wherein the control logic circuit is further configured to set, in response to a number of detected fail cells is greater than or equal to a reference value, one or more fail flags, and the over-bit verify voltage comprises a second verify voltage corresponding to a subsequent program state to the target program state.

According to some embodiments, a method of programming memory cells of a memory device to a plurality of program states comprises performing a first verification operation of verifying selected ones of the memory cells have been programmed to at least a target program state among the plurality of program states, the selected memory cells verified by the first verification operation being identified as program-passed memory cells; determining whether the target program state is a highest program state among the plurality of program states; and performing, when the target program state is a program state other than the highest program state, a second verification operation of detecting fail cells among the selected memory cells, wherein an over-bit verify voltage provided to the program-passed memory cells in the second verification operation comprises a verify voltage corresponding to a subsequent program state to the target program state.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Hereinafter, embodiments of the inventive concept will be described in detail with reference to the accompanying drawings.

Figure 1:
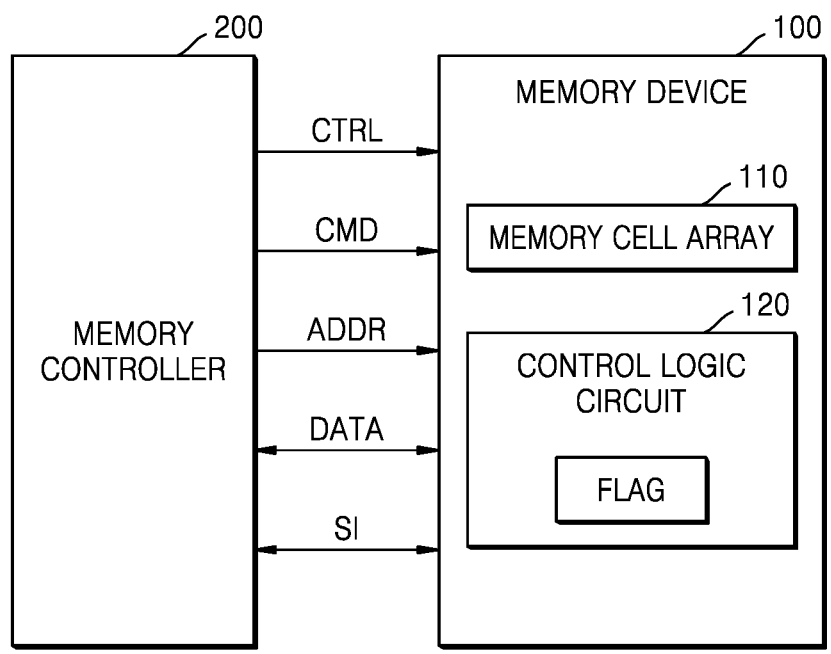
FIG. 1 is a block diagram illustrating a memory system according to an embodiment.

FIG. 1 is a block diagram illustrating a memory system 10 according to an embodiment.

Referring to FIG. 1, the memory system 10 may include a memory device 100 and a memory controller 200. In some examples, the memory device 100 and memory controller 200 each may be a semiconductor chip or may be formed as several stacked semiconductor chips. The memory system 10 may be included in or mounted on electronic devices, such as personal computers (PCs), servers, data centers, smart phones, tablet PCs, autonomous vehicles, portable game consoles, wearable devices, and the like. In some examples, the memory system 10 may be implemented as a storage device, such as a solid-state drive (SSD).

The memory controller 200 may control the overall operation of the memory device 100. In detail, the memory controller 200 may control the memory device 100 by providing the memory device 100 with a command CMD, an address ADDR, and/or a control signal CTRL via a bus connecting the memory controller 200 and memory device 100. The memory device 100 may operate under control by the memory controller 200. The memory device 100 may output stored data DATA or store the data DATA provided from the memory controller 200, under control by the memory controller 200.

In an embodiment, the memory controller 200 may transmit, to the memory device 100, the command CMD for checking the state of the memory device 100. The memory device 100 may transmit, to the memory controller 200, a state information signal SI including information about a fail cell, in response to the command CMD. For example, the state information signal SI may include information about a bad block including the fail cell.

In an embodiment, the memory device 100 may perform a fail cell detection operation while programming the data DATA, and set a fail flag FLAG when a fail cell is detected. In response to the command CMD transmitted from the memory controller 200, the memory device 100 may transmit, to the memory controller 200, the state information signal SI according to the fail flag FLAG. Also, in an embodiment, when no fail cell is detected, the memory device 100 may set a pass flag indicating that a program operation has been passed, and transmit, to the memory controller 200, the state information signal SI according to the pass flag.

The memory device 100 may include a memory cell array 110 and a control logic circuit 120. The memory cell array 110 may include a plurality of memory cells connected to word lines and bit lines. A row address of the address ADDR may identify at least one of the word lines, and a column address of the address ADDR may identify at least one of the bit lines. For example, the plurality of memory cells may be NAND flash memory cells. However, the inventive concept is not limited thereto, and the memory cells may be resistive random-access memory (RRAM) cells, ferroelectric random-access memory (FRAM) cells, phase-change random-access memory (PRAM) cells, thyristor random-access memory (TRAM) cells, magnetoresistive random-access memory (MRAM) cells, or dynamic random-access memory (DRAM) cells. Hereinafter, embodiments of the inventive concept will be described based on an embodiment in which the memory cells are NAND flash memory cells.

In an embodiment, the memory cell array 110 may include word lines stacked in a first direction (e.g., a vertical direction) and channel structures penetrating the word lines and extending in the first direction, i.e., vertical channel structures. Accordingly, the memory cell array 110 may be referred to as a "three-dimensional (3D) memory cell array". For example, when the memory cells are NAND flash memory cells, the memory cell array 110 may be referred to as a "3D NAND memory cell array".

Based on the command CMD, the address ADDR, and the control signal CTRL, the control logic circuit 120 may generate various control signals for programming data to the memory cell array 110, reading data from the memory cell array 110, or erasing data stored in the memory cell array 110. Also, the control logic circuit 120 may generate control signals to perform an operation of detecting a fail cell included in the memory cell array 110 while simultaneously programming data to the memory cell array 110. The control logic circuit 120 may manage information about detected fail cells and may set, for example, the fail flag FLAG.

Figure 2:
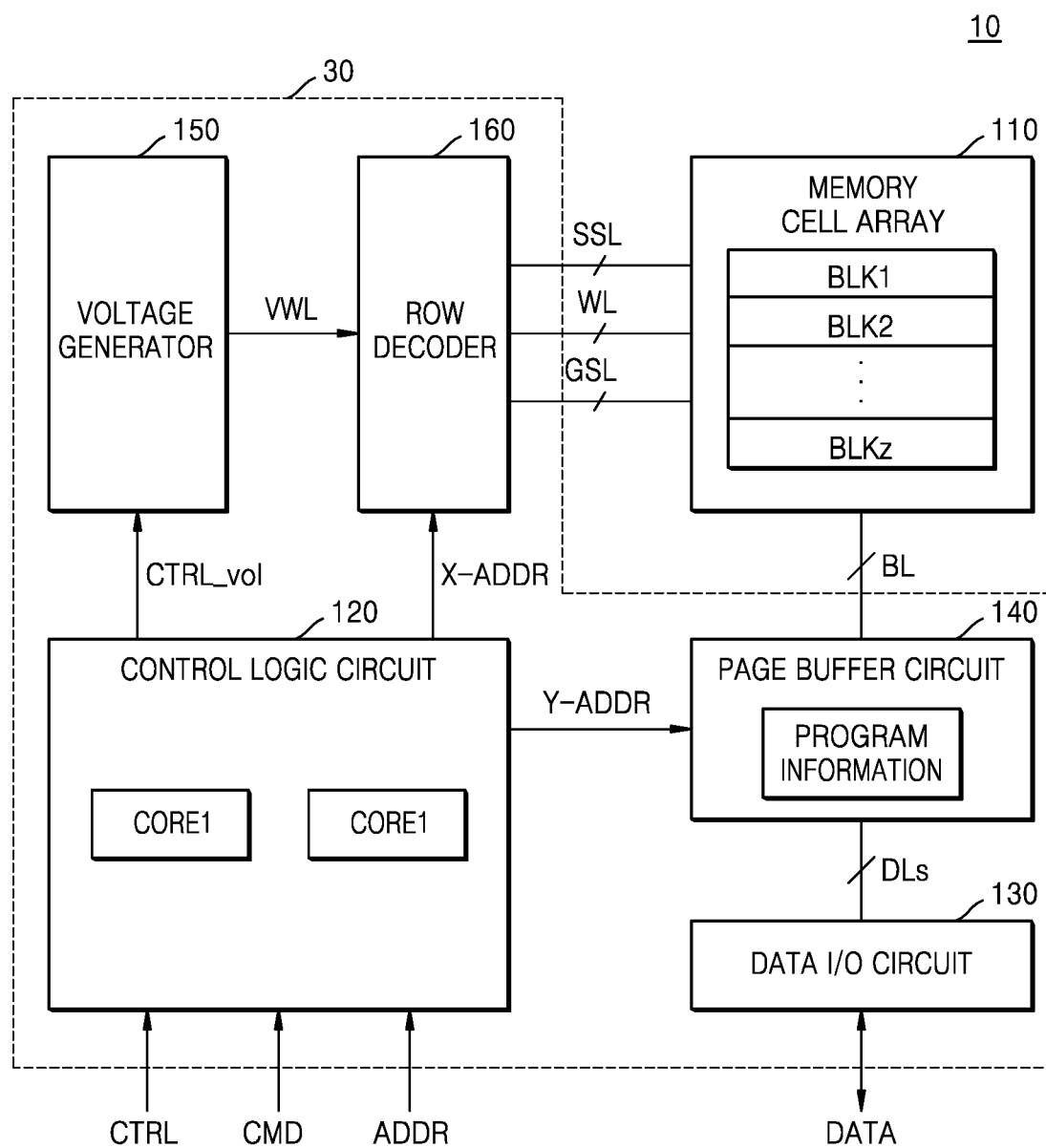
FIG. 2 is a block diagram illustrating a memory device of FIG. 1 according to an embodiment.

FIG. 2 is a block diagram illustrating the memory device 100 of FIG. 1 according to an embodiment.

Referring to FIG. 2, the memory device 100 may include the memory cell array 110, the control logic circuit 120, a data input/output circuit (I/O) 130, a page buffer 140, a voltage generator 150, and a row decoder 160. According to an embodiment, the control logic circuit 120, the data input/output circuit 130, the page buffer 140, the voltage generator 150, and the row decoder 160 may form a "peripheral circuit 30".

Figure 5:
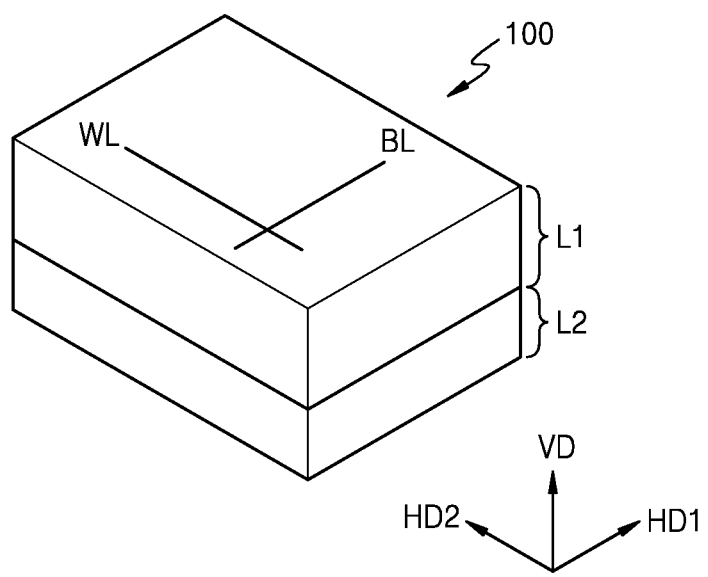
FIG. 5 is a diagram schematically illustrating a structure of a memory device of FIG. 2, according to an embodiment.

In an embodiment, the memory device 100 may have a cell-over-periphery (COP) structure, in which case, the memory cell array 110 may be arranged in a first semiconductor layer (e.g., L1 of FIG. 5), and the peripheral circuit 30 may be arranged in a second semiconductor layer (e.g., L2 of FIG. 5). Also, in an embodiment, the memory device 100 may have a bonding-vertical-NAND (B-VNAND) structure, in which case, the memory cell array 110 may be arranged in a first semiconductor chip (e.g., CELL of FIG. 14), and the peripheral circuit 30 may be arranged in a second semiconductor chip (e.g., PERI of FIG. 14).

The memory cell array 110 may include a plurality of memory blocks BLK1 to BLKz (here, z is a positive integer). Each of the plurality of memory blocks BLK1 to BLKz may include a plurality of memory cells. In some examples, a memory block may be a contiguous section of the non-volatile memory where memory cells within this section are erased together during an erase operation (e.g., in performing an erase operation in response to a single erase command (externally received from memory controller 200, e.g.)). In some examples, a memory block may correspond to the smallest unit of the non-volatile memory that may be individually erased (without the need to erase other portions of the non-volatile memory). For example, a memory blocks may comprise a contiguous area of the non-volatile memory in which a plurality of word lines WL are arranged and addressed (identified) with addresses having the same block address. The memory cell array 110 may be connected to the page buffer 140 through bit lines BL, and may be connected to the row decoder 160 through word lines WL, string select lines SSL, and ground select lines GSL.

In an embodiment, the memory cell array 110 may include a 3D memory cell array including a plurality of NAND strings, as described in detail with reference to FIGS. 4A to 6. U.S. Pat. Nos. 7,679,133, 8,553,466, 8,654,587, 8,559,235, and U.S. Patent Application Publication No. 2011/0233648 disclose appropriate configurations for a 3D memory cell array in which the 3D memory cell array is configured in a plurality of levels and word lines and/or bit lines are shared between the levels, the disclosures of which are incorporated by reference herein.

Based on the command CMD, the address ADDR, and the control signal CTRL, the control logic circuit 120 may output various control signals for programming data to the memory cell array 110, reading data from the memory cell array 110, or erasing data stored in the memory cell array 110, for example, a voltage control signal CTRL_vol, a row address X-ADDR, and a column address Y-ADDR. The control logic circuit 120 may output various control signals for detecting a fail cell, for example, the voltage control signal CTRL_vol, the row address X-ADDR, and the column address Y-ADDR.

In an embodiment, the control logic circuit 120 may include a plurality of cores. For example, the control logic circuit 120 may include a first core configured to perform a fail cell detection operation, and a second core configured to perform normal operations other than the fail cell detection operation. The first core may be a specialized core for performing the fail cell detection operation, and may have a simpler configuration than that of the second core. However, unlike as illustrated in FIG. 2, the control logic circuit 120 may include a single core, and the fail cell detection operation may be performed by the single core.

The data input/output circuit 130 may be connected to the page buffer 140 through a plurality of data lines DLs. The data input/output circuit 130 may provide, through the data lines DLs, the page buffer 140 with the data DATA received from external memory controller 200, or may provide the memory controller 200 with the data DATA received from the page buffer 140 through the data lines DLs. The data input/output circuit 130 may operate according to a control signal from the control logic circuit 120.

The voltage generator 150 may generate various types of voltages to perform program, read, and erase operations on the memory cell array 110, based on the voltage control signal CTRL_vol. In detail, the voltage generator 150 may generate a word line voltage VWL, for example, a program voltage, a read voltage, a pass voltage, an erase verify voltage, a program verify voltage, or an over-bit verify voltage. Also, the voltage generator 150 may further generate a string select line voltage and a ground select line voltage based on the voltage control signal CTRL_vol.

The row decoder 160 may select one of the plurality of memory blocks BLK1 to BLKz in response to the row address X-ADDR (a portion of which may constitute a block address), select one of the word lines WL of the selected memory block (identified by the block address), and select one of the plurality of string select lines SSL. In an embodiment, under control by the control logic circuit 120, the row decoder 160 may provide a program pulse to word lines of a plurality of memory cells, provide a verify voltage to the word lines of the memory cells corresponding to a target program state, and provide an over-bit verify voltage to the word lines of the memory cells programmed into the target program state to detect a fail cell.

The page buffer 140 may select some of the bit lines BL in response to the column address Y-ADDR. The page buffer 140 may operate as a write driver or a sense amplifier according to an operating mode.

In an embodiment, the page buffer 140 may have program information about cells, which have been programmed before performing a fail cell verification operation. The page buffer 140 may perform the fail cell verification operation on previously programmed cells based on the program information.

For example, the page buffer 140 may include a plurality of page buffer latches. Each page buffer latch may be connected to and dedicated to a bit line or a group of bit lines, and each page buffer latch may comprise several latches that store information (e.g., bits) to be programmed, read, indicate a selection or non-selection, indicate an on or off status of a memory cell read (e.g. with a read voltage, a verify voltage or an over-bit verify voltage). Data read from the memory cell array 110 may be stored in the plurality of page buffer latches, or data to be programmed to the memory cell array 110 may be temporarily stored in the plurality of page buffer latches. In an embodiment, programmed data and data to be programmed may be stored together in a page buffer latch (e.g., in corresponding latches that form the page buffer latch). Also, state information about cells programmed before performing a fail cell verification operation may be stored in the page buffer latch.

Figure 3:
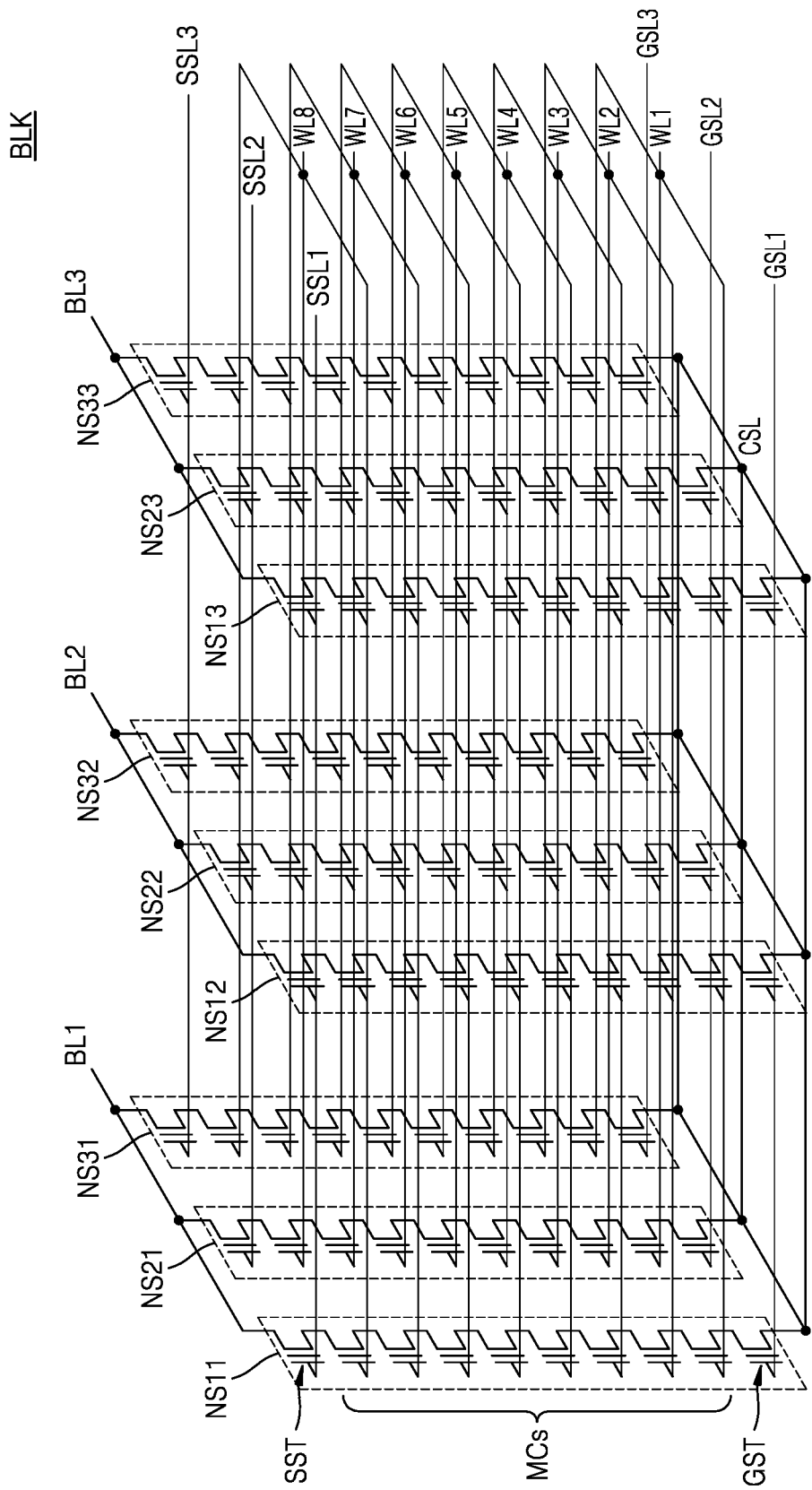
FIG. 3 is a circuit diagram illustrating a memory block according to an embodiment.

FIG. 3 is a circuit diagram illustrating a memory block BLK according to an embodiment.

Referring to FIG. 3, the memory block BLK may correspond to one of the plurality of memory blocks BLK1 to BLKz of FIG. 2. The memory block BLK may include NAND strings NS11 to NS33, and each NAND string (e.g., NS11) may include a string select transistor SST, a plurality of memory cells MCs, and a ground select transistor GST, which are connected in series. The string select and ground select transistors SST and GST and the memory cells MCs included in each NAND string may form a stacked structure on a substrate in a vertical direction.

Word lines WL1 to WL8 may extend in a second horizontal direction, and bit lines BL1 to BL3 (hereinafter, also referred to as the first to third bit lines BL1 to BL3) may extend in a first horizontal direction. The NAND strings NS11, NS21, and NS31 may be between may be between the first bit line BL1 and a common source line CSL, the NAND strings NS12, NS22, and NS32 are between the second bit line BL2 and the common source line CSL, and the NAND strings NS13, NS23, and NS33 may be positioned between the third bit line BL3 and the common source line CSL. The string select transistors SST may be connected to their corresponding string select lines SSL1 to SSL3, respectively. The memory cells MCs may be connected to their corresponding word lines WL1 to WL8, respectively. The ground select transistors GST may be connected to their corresponding ground select lines GSL1 to GSL3, respectively. The string select transistors SST may be connected to their corresponding bit lines, respectively, and the ground select transistors GST may be connected to the common source line CSL. Here, the number of NAND strings, the number of word lines, the number of bit lines, the number of ground select lines, and the number of string select lines may vary depending on embodiments.

Figure 4A:
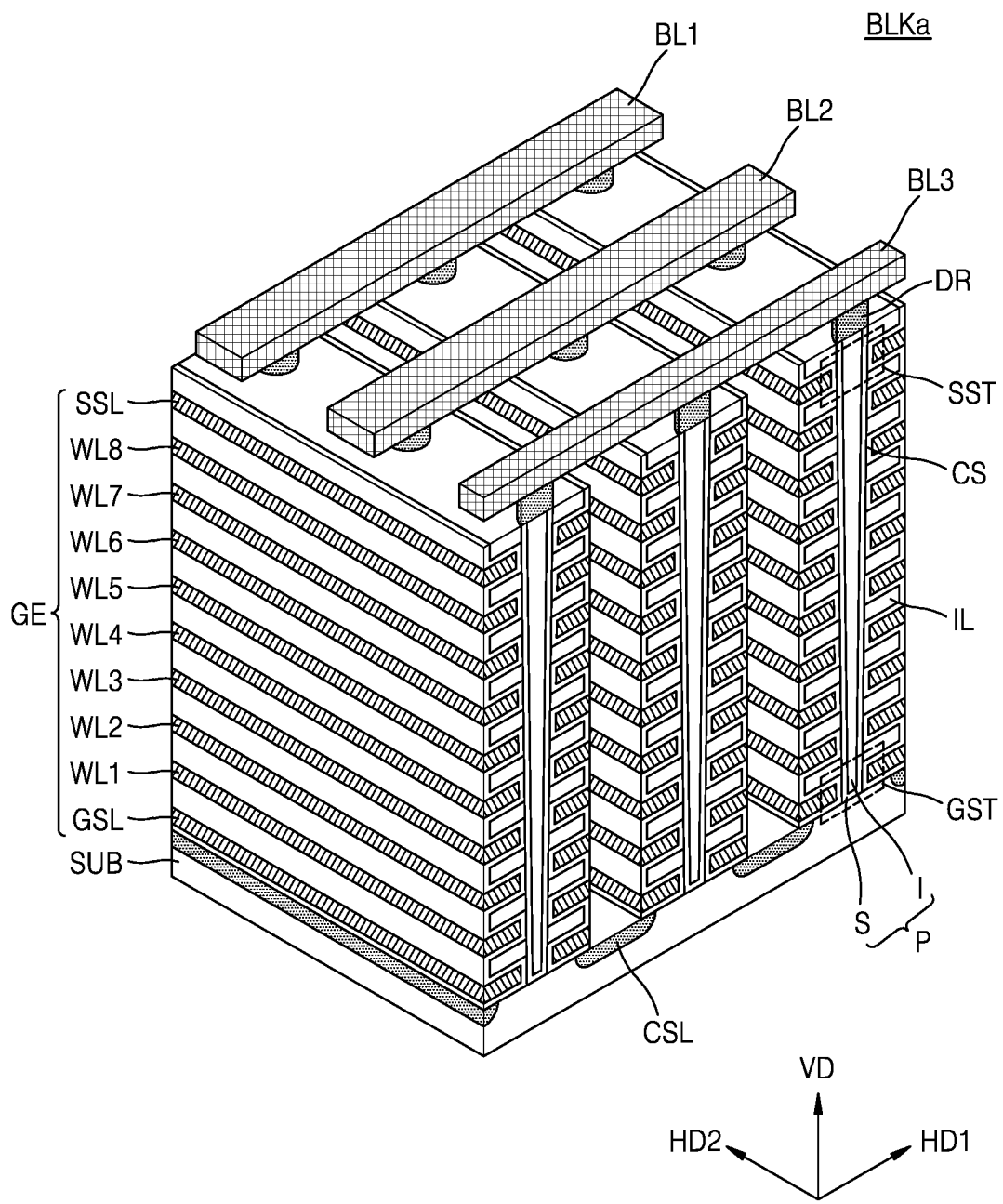
FIG. 4A is a perspective view illustrating a memory block according to an embodiment.

FIG. 4A is a perspective view illustrating a memory block BLKa according to an embodiment.

Referring to FIG. 4A, the memory block BLKa may correspond to one of the plurality of memory blocks BLK1 to BLKz of FIG. 2. The memory block BLKa comprise a plurality of word lines WL stacked in a direction perpendicular to a substrate SUB. The substrate SUB has a first conductivity type (e.g., p type), and the common source line CSL, which extends in a second horizontal direction HD2 and is doped with impurities of a second conductivity type (e.g., n type), is provided on the substrate SUB. A plurality of insulating layers IL extending in the second horizontal direction HD2 are sequentially provided in a vertical direction VD in a region of the substrate SUB between two adjacent common source lines CSL, and the plurality of insulating layers IL are spaced a certain distance from each other in the vertical direction VD. For example, the plurality of insulating layers IL may include an insulating material, such as silicon oxide.

A plurality of pillars P are provided in a region of the substrate SUB between two adjacent common source lines CSL, to be sequentially arranged in a first horizontal direction HD1 and penetrate the plurality of insulating layers IL in the vertical direction VD. For example, the plurality of pillars P may penetrate the plurality of insulating layers IL and be in contact with the substrate SUB. In detail, a surface layer S of each of the pillars P may include a first-type silicon material and function as a channel region. An inner layer I of each of the pillars P may include an insulating material, such as silicon oxide, or an air gap.

In a region between two adjacent common source lines CSL, a charge storage layer CS is provided along exposed surfaces of the insulating layers IL, the pillars P, and the substrate SUB. The charge storage layer CS may include a gate insulating layer (also referred to as a 'tunneling insulating layer'), a charge trapping layer, and a blocking insulating layer. For example, the charge storage layer CS may have an oxide-nitride-oxide (ONO) structure. In addition, in a region between two adjacent common source lines CSL, gate electrodes GE including the select lines GSL and SSL and the word lines WL1 to WL8 are provided on the exposed surface of the charge storage layer CS. Memory cells are formed at the intersections of the pillars P and word lines WL (a memory cell formed where a pillar extends through a of word line WL) in the form of memory cell transistors, with each memory cell transistor having a gate formed by the corresponding word line WL, source drain S/D regions and a channel formed by the surface layer S of the pillars P, and a charge storage element formed by the charge storage layer CS interposed between the gate and channel of the memory cell transistor. Each memory cell transistor may have a threshold voltage that may be changed based on the amount of charge stored by its charge storage element so that the voltage at which the memory cell transistor turns on or remains off may be varied. The memory cell transistor may thus be programmed to a desired program state (e.g., a target program state of a corresponding threshold voltage range to represent one or more bits of data.

Drains or drain contacts DR are provided on the plurality of pillars P, respectively. For example, the drains or the drain contacts DR may include a silicon material doped with impurities having the second conductivity type. The bit lines BL1 to BL3 extending in the first horizontal direction HD1 and spaced a certain distance from each other in the second horizontal direction HD2 are provided on the drain contacts DR.

Figure 4B:
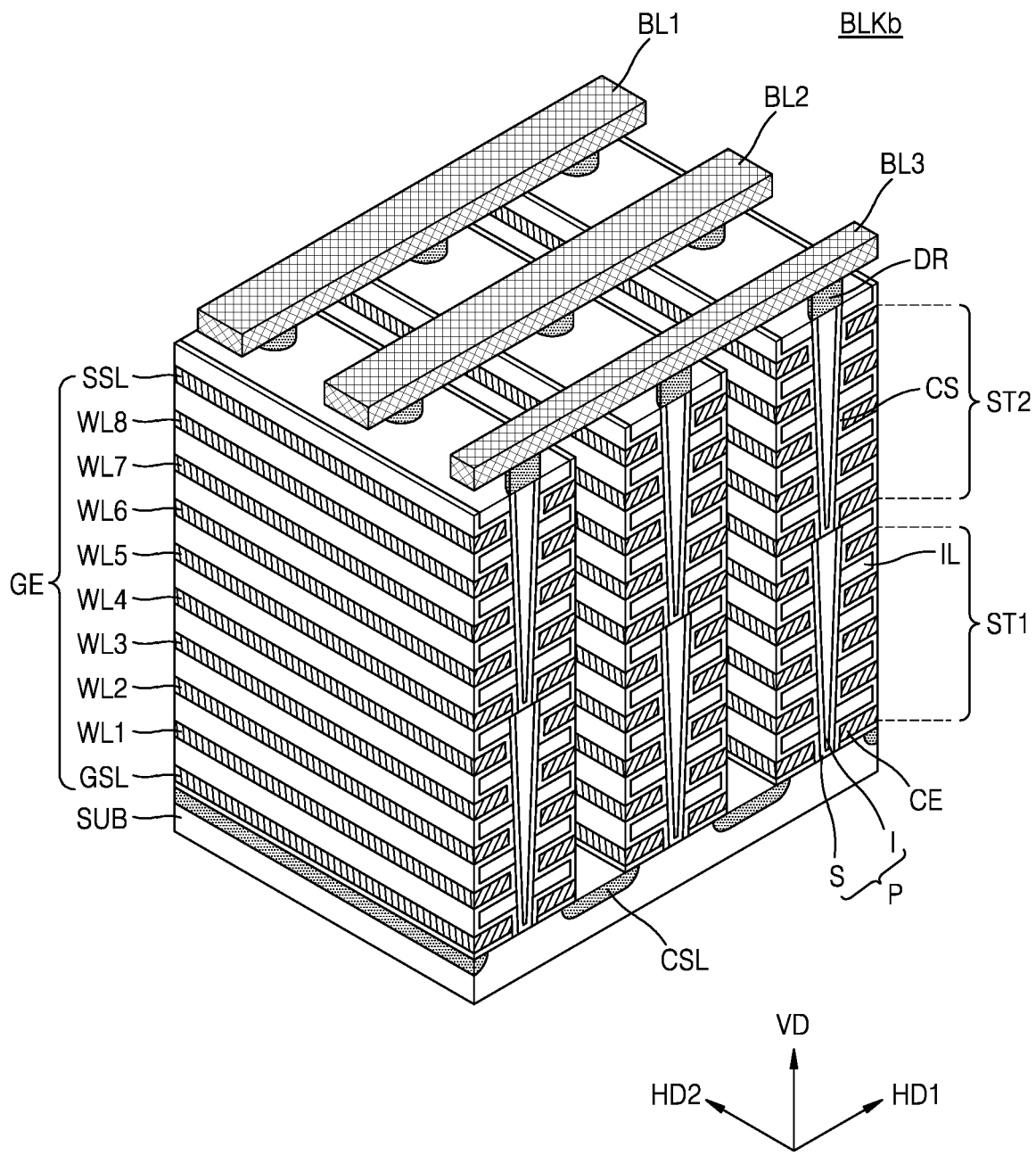
FIG. 4B is a perspective view illustrating a memory block according to an embodiment.

FIG. 4B is a perspective view illustrating a memory block BLKb according to an embodiment.

Referring to FIG. 4B, the memory block BLKb may correspond to one of the plurality of memory blocks BLK1 to BLKz of FIG. 2. In addition, the memory block BLKb corresponds to a modification of the memory block BLKa of FIG. 4A, and the descriptions provided above with reference to FIG. 4A may also be applied to the present embodiment. The memory block BLKb is formed in a direction perpendicular to the substrate SUB. The memory block BLKb may include a first memory stack ST1 and a second memory stack ST2, which are stacked in the vertical direction VD.

FIG. 5 is a diagram schematically illustrating a structure of the memory device 100 of FIG. 2, according to an embodiment.

Referring to FIG. 5, the memory device 100 may include a first semiconductor layer L1 and a second semiconductor layer L2, and the first semiconductor layer L1 may be stacked in the vertical direction VD with respect to the second semiconductor layer L2. In detail, the second semiconductor layer L2 may be arranged below the first semiconductor layer L1 in the vertical direction VD, and accordingly, may be arranged close to the substrate (e.g., a crystalline semiconductor substrate, such as a crystalline silicon bulk substrate forming the initial structure in and on which the remaining structure is subsequently formed).

In an embodiment, the memory cell array 110 of FIG. 2 (which may include memory block BLKa of FIG. 4A or memory block BLKb of FIG. 4B) may be formed in the first semiconductor layer L1, and a peripheral circuit including the control logic circuit 120, the data input/output circuit 130, the page buffer 140, the voltage generator 150, and the row decoder 160 of FIG. 2 may be formed in the second semiconductor layer L2 (in locations directly below the memory cell array 110). Accordingly, the memory device 100 may have a structure in which the memory cell array 110 is arranged on top of the peripheral circuit, i.e., a COP structure. The COP structure may effectively reduce a horizontal area and improve the degree of integration of the memory device 100.

In an embodiment, the second semiconductor layer L2 may include a substrate (e.g., a crystalline semiconductor substrate), and the peripheral circuit may be formed in the second semiconductor layer L2 by forming transistors and metal patterns for the wiring of the transistors in and/or on the substrate. After the peripheral circuit is formed in the second semiconductor layer L2, the first semiconductor layer L1 including the memory cell array 110 may be formed, and metal patterns for electrically connecting the word lines WL and bit lines BL of the memory cell array 110 to the peripheral circuit formed in the second semiconductor layer L2 may be formed (e.g., with conductive vias extending within the first semiconductor layer to conductive pads at or within the second semiconductor layer L2). For example, the bit lines BL may extend in the first horizontal direction HD1, and the word lines WL may extend in the second horizontal direction HD2. For example, plural ones of the memory block BLKa of FIG. 4A or plural ones of the memory block BLKb of FIG. 4B may be formed in the first semiconductor layer L1 on the second semiconductor layer L2, such as by forming substrate SUB of memory block BLKa or BLKb on an upper portion of the second semiconductor layer L2 and then forming the remaining structure of memory block BLKa or BLKb with substrate SUB/second semiconductor layer L2.

Figure 6:
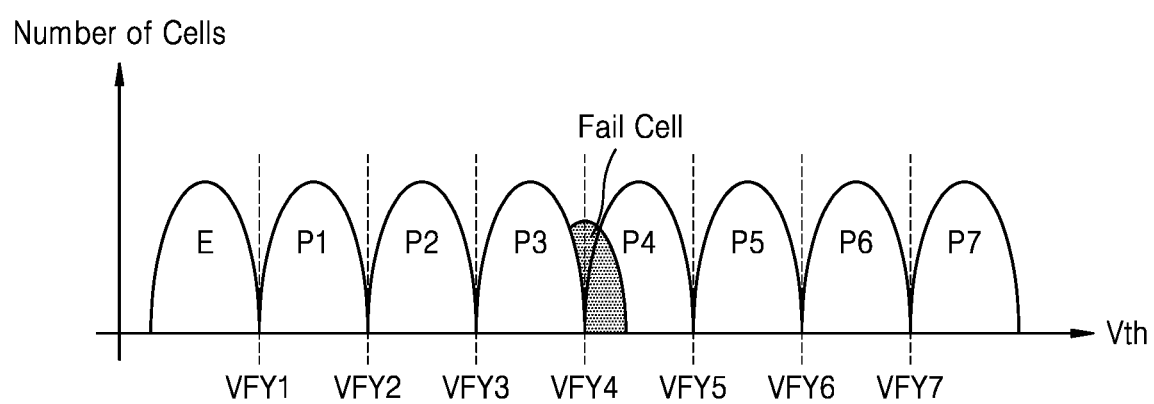
FIG. 6 is a diagram for describing a distribution of threshold voltages of memory cells in a memory cell array of FIG. 2.

FIG. 6 is a diagram for describing a distribution of threshold voltages of memory cells in the memory cell array 110 of FIG. 2.

Referring to FIG. 6, in the distribution, the horizontal axis represents a threshold voltage Vth, and the vertical axis represents the number of memory cells. For example, when the memory cell is a triple-level cell (TLC) programmed to store 3 bits, the memory cell may have one of an erase state E and first to seventh program states P1 to P7. For example, the erase state E and each program state (e.g., P1 to P7) may correspond to (e.g., be defined by) a corresponding range of a threshold voltage of the memory cell transistor forming the memory cell. A case in which the memory cell is a TLC has been described herein as an example, but the inventive concept is not limited thereto and is also applicable to a single-level cell (SLC) programmed to have 1 bit, a multi-level cell (MLC) programmed to have 2 bits, or a quad-level cell (QLC) programmed to have 4 bits. The erase state E and each program state (e.g., P1 to P7) may be assigned a value and/or identify the values of the bits (or bit in the case of SLC) stored by the memory cell. As an example, program state P3 may correspond to a threshold voltage Vth in the range of VFY3 to VFY4 and a memory cell having a threshold voltage within this range may be recognized as storing a value of 011 (binary) for the 3 bits of data stored in this memory cell in this example.

First to seventh verify voltages VFY1 to VFY7 may be used to determine the states of the memory cells, respectively, i.e., the erase state E and the first to seventh program states P1 to P7. Each of the first to seventh verify voltages VFY1 to VFY7 may be a voltage level for determining a corresponding program state among the first to seventh program states P1 to P7. For example, the first verify voltage VFY1 may be a voltage level for determining the first program state P1, and the seventh verify voltage VFY7 may be a voltage level for determining the seventh program state P7.

In general, prior to programming, a memory block is erased so that all memory cells are put in the erase state E. When a page of memory cells (e.g., memory cells connected to (e.g., having gates connected to or formed by) a word line of a memory block) are to be programmed (to have data written therein), the word line is selected and selected memory cells of that word line are subject to a series of programming operations to increase threshold voltages of the selected memory cells (as appropriate) to achieve the desired program state (P1 to P7). For example, programming a page of memory cells may comprise (n−1) program state operations (where n is the number of program states), where each program state operation comprises applying a sequence of program voltage pulses to selected memory cells of a selected word line until each of the selected memory cells achieves the program state of that program state operation (i.e., achieves the target program state). Increasing the threshold voltages of a memory cell is achieved by subjecting the memory cell to a program voltage (to increase the amount of charge stored by the corresponding charge storage element of the memory cell transistor, e.g.). During a particular program state operation (e.g., an $i^{th}$ program state operation), after each program pulse is applied, memory cells are read during a read verify operation to determine if the threshold voltages of the selected memory cells have increased to at least the lower end of the range of the $i^{th}$ program state (the target program state). Those selected memory cells identified as not having their threshold voltage increased to at least the lower end of the range of the $i^{th}$ program state are subjected to another program pulse to continue to increase their threshold voltages toward the $i^{th}$ program state (while those that have reached the $i^{th}$ program state are no longer subject to programming pulses during the $i^{th}$ program state operation). This cycle of program pulse/read verify operations continues until all selected memory cells have been verified in this manner (or a predetermined (e.g., maximum) number of programming pulses have been applied without success thus indicating a programming failure). Subsequently, an $(i+1)^{th}$ program state operation may be performed in a similar manner such that memory cells selected for the $(i+1)^{th}$ program state (the new target program state) are subjected to a series of programming pulses via several cycles of program pulse/read verify operations.

A memory cell, even though it has already been subject to program voltages in an attempt to put the memory cell in a target program state, may be sensed as being an on-cell (i.e., determined to be under-bit or insufficiently programmed to a target program state) in a verification operation, and thus, a higher program voltage (and/or a program voltage of longer duration) may be applied thereto. However, fail cells may be overprogrammed to have a higher threshold voltage than that of the target program state (i.e., overprogrammed to be over-bit). As illustrated in FIG. 6, fail cells that were intended to be programmed to the third program state P3 as the target program state may have a higher distribution of threshold voltages than that of the third program state P3. Therefore, when the fail cell is not detected and managed in advance, a read error may occur. Here, the read error may correspond to a case in which the number of fail bits in read data exceeds a threshold number, which is the number of fail bits correctable by an error correction code (ECC) associated with the data being stored (e.g., of the page(s) of data being stored by memory cells of a word line), and accordingly, the read error may be referred to as uncorrectable ECC (UECC). Therefore, the memory device according to an embodiment of the inventive concept may detect an overprogrammed fail cell in advance, thereby preventing a UECC failure that may have otherwise occurred from occurring in a subsequent read operation.

Figure 7:
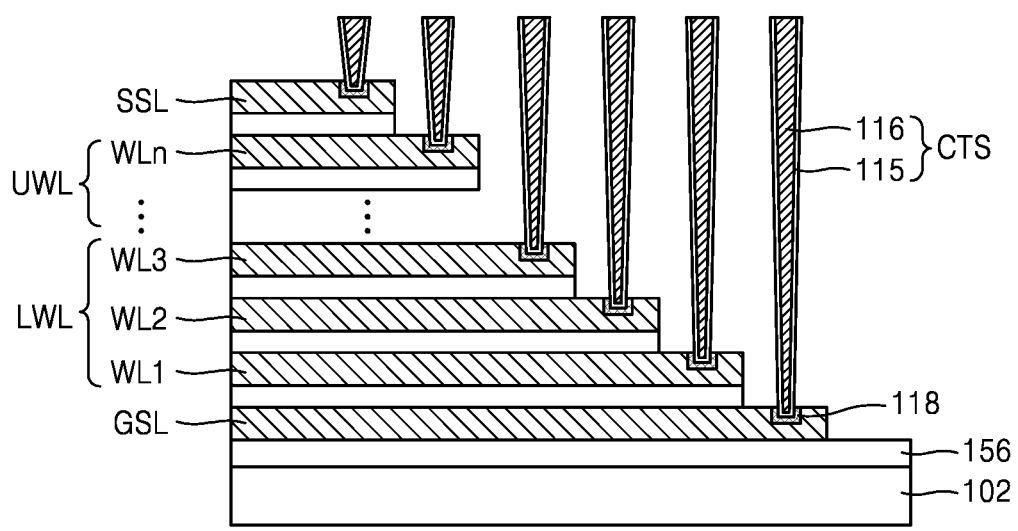
FIG. 7 is a diagram for describing a structure of a word line and a word line contact.
Figure 8:
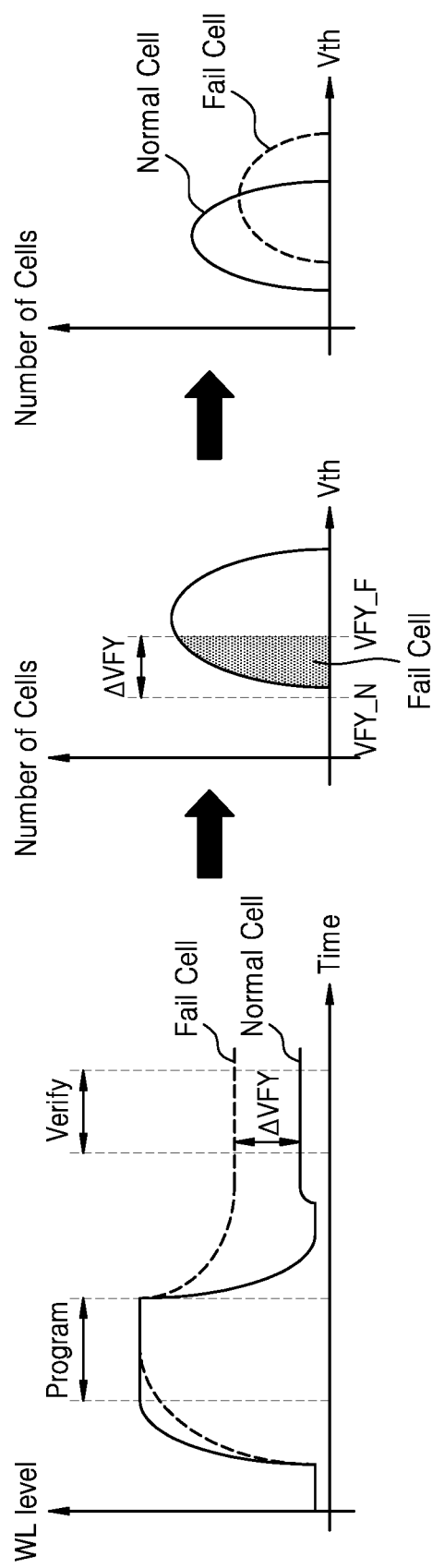
FIG. 8 is a diagram for describing characteristics of a fail cell.

FIG. 7 is a diagram for describing a structure of a word line and a word line contact, and FIG. 8 is a diagram for describing characteristics of a fail cell.

Referring to FIG. 7, a memory device may include a plurality of gate lines stacked on a substrate 102. The substrate 102 may be semiconductor substrate, such as a substrate formed of crystalline Si, Ge, or SiGe.

The plurality of gate lines may include a plurality of word lines WL1, WL2, WL3, . . . , WLn (here, n is a natural number) (e.g., WL in FIG. 2), at least one ground select line GSL, and at least one string select line SSL. The areas of the plurality of gate lines in a horizontal plane may gradually decrease as their distances from the substrate 102 increase. For example, the number of gate lines stacked in the vertical direction may be 48, 64, 96, or 128, but is not limited thereto, and may be variously modified. In addition, although FIG. 7 illustrates a case in which the plurality of gate lines include one ground select line GSL and one string select line SSL, the technical spirit of the inventive concept is not limited thereto, and the number of ground select lines GSL and string select lines SSL may be two or more.

Each of the plurality of word lines WL1, WL2, WL3, . . . , WLn, the ground select line GSL, and the string select line SSL may be formed of a metal, a conductive metal nitride, or a combination thereof. For example, the plurality of gate lines may be formed of tungsten, nickel, cobalt, tantalum, tungsten nitride, titanium nitride, tantalum nitride, or a combination thereof, but is not limited thereto.

An insulating layer 156 may be between the substrate 102, the ground select line GSL, the ground select line GSL, the plurality of word lines WL1, WL2, WL3, . . . , WLn, and the string select line SSL. The insulating layer 156 may be formed of silicon oxide, silicon nitride, or SiON.

A plurality of contact structures CTS extending in the vertical direction may be formed on extended regions of the plurality of word lines WL1, WL2, WL3, . . . , WLn, respectively. Metal silicide layers 118 may be formed between the plurality of word lines WL1, WL2, WL3, . . . , WLn and the plurality of contact structures CTS, respectively. Alternatively, unlike that illustrated in FIG. 7, metal silicide layers 118 may not be formed between the plurality of word lines WL1, WL2, WL3, . . . , WLn and the plurality of contact structures CTS.

Each of the plurality of contact structures CTS may include a contact plug 116 elongated in the vertical direction and an insulating plug 115 surrounding the contact plug 116. The contact plug 116 of each of the plurality of contact structures CTS may be connected to the plurality of word lines WL1, WL2, WL3, . . . , WLn through the plurality of metal silicide layers 118.

Each of the contact plugs 116 may be formed of tungsten, titanium, tantalum, copper, aluminum, titanium nitride, tantalum nitride, tungsten nitride, or a combination thereof. The insulating plug 115 may be formed of a portion of a silicon nitride film, a silicon oxide film, or a combination thereof.

The insulating plug 115 may include a portion between the lower end of the contact plug 116 and the metal silicide layer 118. Resistance characteristics of the plurality of word lines WL1, WL2, WL3, . . . , WLn (more specifically, between the contact plugs 116 and word lines WL) may vary depending on an insulating material (e.g., a silicon nitride film) between the contact plug 116 and the plurality of word lines WL1, WL2, WL3, . . . , WLn. Such a resistance failure may result in an overprogrammed fail cell.

Referring to FIG. 8, after a program operation in which a program pulse is applied to a selected word line to program the memory cells of that word line to increase their threshold voltages to achieve a target program state, a verification operation (e.g., a read verify operation) in which a verify voltage is applied to the word line may be performed. In the verification operation, the word line level of a normal cell may be a normal verify voltage level VFY_N, corresponding to the target program state. Applying the normal verify voltage level VFY_N to the selected word line, memory cells of the word line WL selected to be programmed to the target program state are read to determine if their threshold voltage has been increased to at least the lower end of the target program state. However, even when the normal verify voltage level VFY_N is applied to the word line of the normal cell and a fail cell in the verification operation, the word line level of the fail cell may be a fail verify voltage level VFY_F that is higher by ΔVFY than the normal verify voltage level VFY_N due to a resistance failure in the verification operation.

After the program pulse is applied to the word lines, the fail cell, even though it is programmed to have a threshold voltage above the lower end of a target program state, may be determined to be unprogrammed, due to fail verify voltage level VFY_F in the verification operation. Accordingly, a program pulse may be additionally applied to the fail cells, finally the distribution of threshold voltages of the fail cells may be shifted to the right of the distribution of threshold voltages of normal cells, and the width of the overall distribution of all the memory cells of the word line WL may increase. Thus, the fail cells may be overprogrammed such that some of the fail cells have a voltage threshold that is higher than the upper end of the target program state.

As described above with reference to FIG. 7, a fail cell due to a resistance failure may be generated by a connection between the plurality of word lines WL1, WL2, WL3, . . . , WLn and the plurality of contact structures CTS. Accordingly, a probability that a fail cell is formed due to poor resistance in the memory cells connected to the plurality of word lines WL1, WL2, WL3, . . . , WLn, respectively, may vary depending on the structural characteristics of the plurality of word lines WL1, WL2, WL3, . . . , WLn. For example, as the height at which the plurality of contact structures CTS extend in the vertical direction increases, the probability that a memory cell connected to the corresponding contact structure CTS becomes a fail cell may increase. That is, as the distance between a word line on which a memory cell is formed and the substrate 102 decreases, the probability that the memory cell becomes a fail cell may increase. However, this is only an example, and a fail cell may be generated in various positions of a 3D memory cell array.

Considering the possibility of the formation of a fail cell, in an embodiment, the memory device may selectively perform a fail cell detection operation on memory cells formed in some of the plurality of word lines WL1, WL2, WL3, . . . , WLn, rather than on all of the plurality of word lines WL1, WL2, WL3, . . . , WLn. For example, a memory cell array (e.g., 110 of FIG. 2) may be divided into a first memory region including memory cells formed in lower word lines LWL (as shown in FIG. 7), which are arranged relatively close to the substrate 102 among the plurality of word lines WL1, WL2, WL3, . . . , WLn, and a second memory region including memory cells formed in upper word lines UWL (as shown in FIG. 7), which are arranged relatively far from the substrate 102, and the memory device may perform a fail cell detection operation on the first memory region. For example, 10 or 20 word lines arranged close to the substrate 102 may be the lower word lines LWL, and the memory cells formed in the lower word lines LWL may be classified as the first memory region. The memory device may perform a fail cell detection operation on the first memory region by applying an over-bit verify voltage to the lower word lines LWL but avoid performing a fail cell detection operation on the second memory region so that an over-bit verify voltage is not applied to the upper word lines UWL. However, the inventive concept is not limited thereto, and the memory device may perform a fail cell detection operation on the memory cells formed in all of the plurality of word lines WL1, WL2, WL3, . . . , WLn, i.e., in both the first memory region and the second memory region.

Figure 9A:
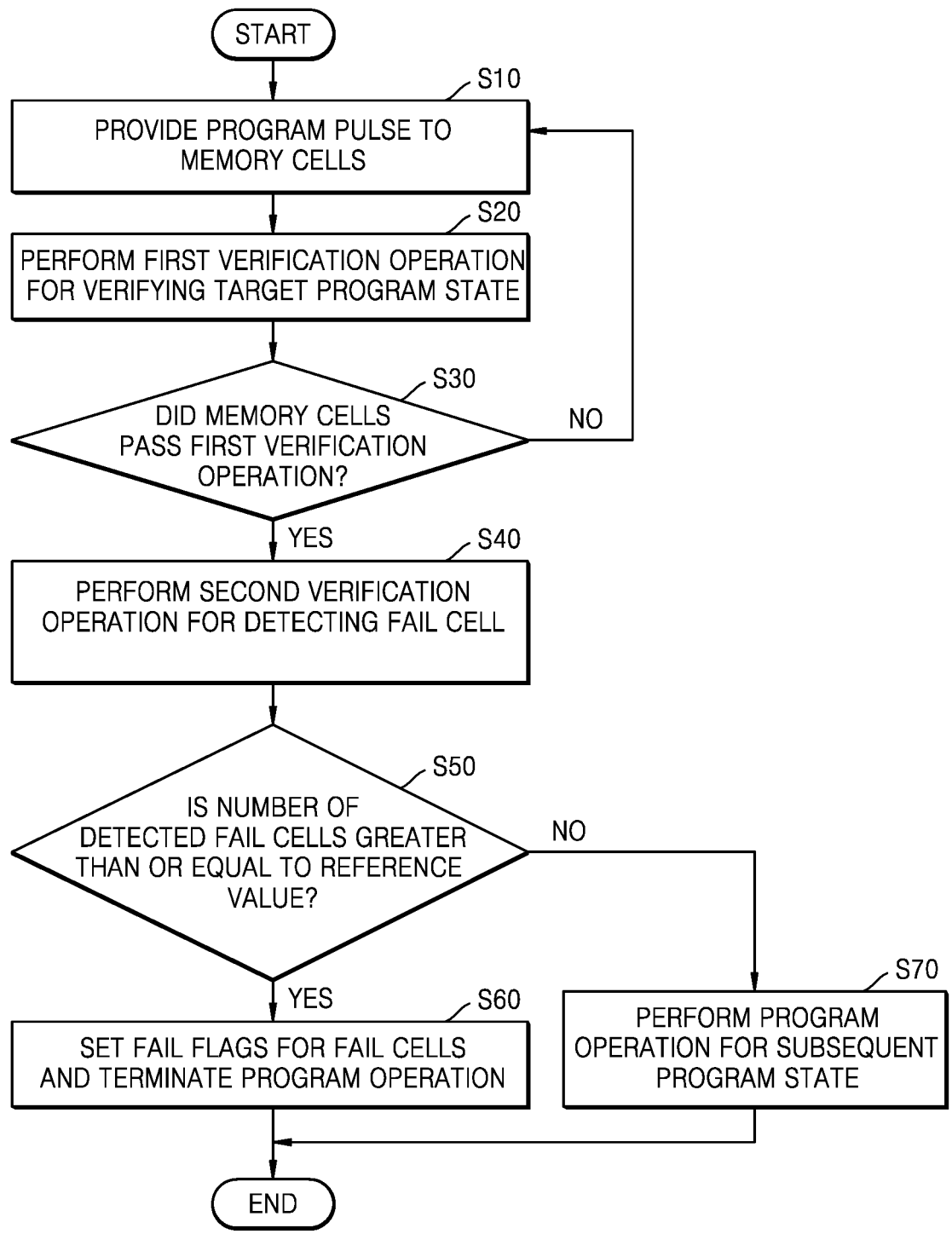
FIGS. 9A and 9B are flowcharts for describing an operation method of a memory device according to an embodiment of the inventive concept.
Figure 9B:
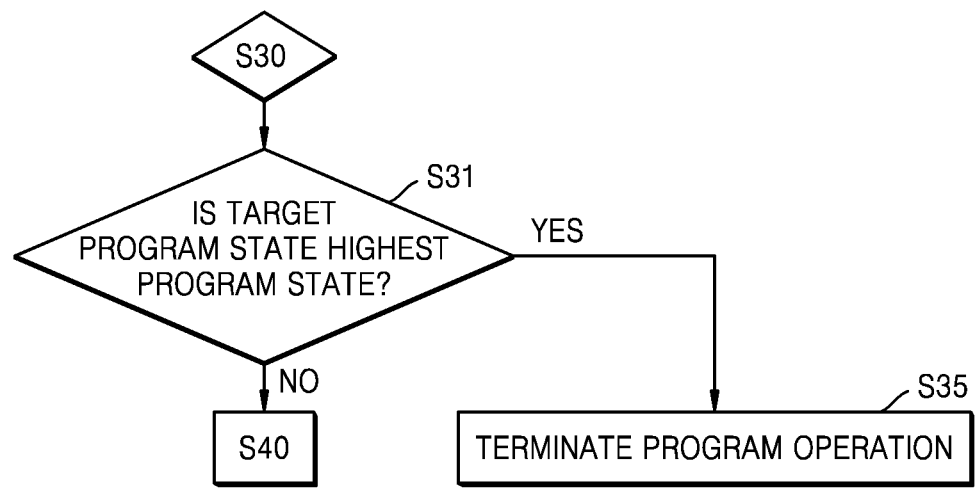

FIGS. 9A and 9B are flowcharts for describing an operation method of a memory device according to an embodiment of the inventive concept. Operations S10 to S30 of FIG. 9A may be program operations for a target program state, and operations S10 to S50 of FIG. 9A may be performed for each of a plurality of program states. For example, for a memory cell that is a TLC, operations S10 to S50 are performed for the first program state P1, which is the lowest program state, and then operations S10 to S50 may be sequentially performed for each of the second to seventh program states P2 to P7. It will be appreciated that operation S60 represents the termination of the program operation (as discussed herein) while operation S70 represents the performing operations S10 to S50 for the next target program state.

Referring to FIG. 9A, in operation S10, the memory device may provide a program pulse to memory cells. The memory device may provide a selected word line of the memory cells with a program pulse in order to program the memory cells to the target program state.

In operation S20, the memory device may perform a first verification operation for verifying programming to at least the target program state. For example, the memory device may perform the first verification operation by providing the word lines of the memory cells corresponding to the target program state with the verify voltage corresponding to a lower end of the target program state, and sensing bit lines of the memory cells.

In operation S30, the memory device may determine whether all of the memory cells have passed the first verification operation. When the first verification operation is passed, it may be determined that the memory cells have program-passed for the target program state (and may be referred to herein as program-passed memory cells).

For example, as described with reference to FIG. 6, in order to check whether the memory cells are programmed to the target program state (e.g., the third program state P3), a verify voltage (e.g., a third verify voltage VFY3) corresponding to the target program state may be provided to the word lines of the memory cells. When threshold voltages of the memory cells are greater than or equal to the third verify voltage VFY3, it may be determined that the program cycle is completed for this target program state, and thus, the first verification operation may be passed. On the contrary, when the threshold voltages of the memory cells are lower than the third verify voltage VFY3, it may be determined that the program is not completed, and thus, the first verification operation is not passed.

When the first verification operation is not passed, the memory device may perform operation S10 again. When performing operation S10 again, the memory device may provide a program pulse only to those memory cells that were selected for programming to the target program state and that have not passed the first verification operation (i.e., those having threshold voltages lower than the verify voltage).

In operation S40, the memory device may perform a second verification operation for detecting a fail cell. Here, detecting a 'fail cell' may refer to a memory cell that is overprogrammed with respect to the target program state. The second verification operation may have different conditions from those of the first verification operation. An over-bit verify voltage may be applied to the selected word line subjected to the second verification operation, and memory cells of the selected word line may be read. For example, the memory device may perform the second verification operation by providing the word lines of the memory cells programmed to the target program state with the over-bit verify voltage that is greater than the verify voltage corresponding to the target program state, and sensing the bit lines of the memory cells. Memory cells having threshold voltages greater than the over-bit verify voltage may be recognized as being overprogrammed and detected as fail cells.

In an embodiment, the over-bit verify voltage may be a verify voltage corresponding to a program state higher than the target program state. For example, when the target program state is the third program state P3, the over-bit verify voltage may be the same as the fourth verify voltage VFY4 corresponding to a fourth program state (e.g., P4 of FIG. 6) immediately above the third program state P3. However, the inventive concept is not limited thereto, and the over-bit verify voltage may have other offsets from the verify voltage corresponding to the program state higher than the target program state.

In an embodiment, the duration during which a verify voltage (e.g., the third verify voltage VFY3) corresponding to the target program state is applied in the first verification operation may differ from the duration during which the over-bit verify voltage is applied in the second verification operation. For example, the duration during which the over-bit verify voltage is applied in the second verification operation may be shorter than the duration during which the verify voltage is applied in the first verification operation, but the inventive concept is not limited thereto.

In an embodiment, voltages applied to unselected word lines other than the selected word lines in the first verification operation and the second verification operation may have different conditions. For example, to word lines (e.g., the second word line WL2 and the fourth word line WL4 of FIG. 7) closest to a selected word line (e.g., it is assumed that the third word line WL3 of FIG. 7 is selected), a voltage of a first voltage level may be applied for a first duration in the first verification operation, whereas a voltage of a second voltage level may be applied for a second duration in the second verification operation. In this case, the first voltage level and the second voltage level may be different from each other, and the first duration and the second duration may be different from each other. For example, the first voltage level may be 7 V, the second voltage level may be 6 V, the first duration may be 15 μs, and the second duration may be 6 μs. However, this is an example, and the first voltage level, the second voltage level, the first duration, and the second duration may be variously adjusted.

For example, to word lines (e.g., the first word line WL1 and the fifth word line WL5 of FIG. 7) second-closest to a selected word line (e.g., the third word line WL3 of FIG. 7), a voltage of a third voltage level may be applied for a third duration in the first verification operation, whereas a voltage of a fourth voltage level may be applied for a fourth duration in the second verification operation. In this case, the third voltage level and the fourth voltage level may be different from each other, and the third duration and the fourth duration may be different from each other. For example, the third voltage level may be 6.5 V, the fourth voltage level may be 6 V, the third duration may be 15 μs, and the fourth duration may be 6 μs. However, this is an example, and the third voltage level, the fourth voltage level, the third duration, and the fourth duration may be variously adjusted. The third voltage level may be different from the first voltage level, and the fourth voltage level may be different from the second voltage level.

In addition, for example, to unselected word lines (e.g., the sixth to n-th word lines WL6 to WLn of FIG. 7) except for the word lines closest and second-closest to a selected word line (e.g., the third word line WL3 of FIG. 7), a voltage of a fifth voltage level may be applied for a fifth duration in the first verification operation, whereas a voltage of a sixth voltage level may be applied for a sixth duration in the second verification operation. In this case, the fifth voltage level and the sixth voltage level may be different from each other, and the fifth duration and the sixth duration may be different from each other. For example, the fifth voltage level may be 6 V, the sixth voltage level may be 5 V, the fifth duration may be 15 μs, and the sixth duration may be 6 μs. However, this is an example, and the fifth voltage level, the sixth voltage level, the fifth duration, and the sixth duration may be variously adjusted. The fifth voltage level may be different from the first voltage level, and the sixth voltage level may be different from the second voltage level.

In an embodiment, bit line shut-off voltages provided to a page buffer (e.g., 140 of FIG. 2) in the first verification operation and the second verification operation may have different conditions. The bit line shut-off voltage is a signal for switching a transistor connecting a bit line to a sensing node, and sensing data may be stored in the page buffer 140 based on a potential of the sensing node. The bit line shut-off voltage at a seventh voltage may be applied level for a seventh duration in the first verification operation, whereas the bit line shut-off voltage at an eighth voltage level may be applied for an eighth duration in the second verification operation. For example, the seventh voltage level may be 2 V, the eighth voltage level may be 2.5 V, the seventh duration may be 15 μs, and the sixth duration may be 6 μs. However, this is an example, and the seventh voltage level, the eighth voltage level, the seventh duration, and the eighth duration may be variously adjusted. In addition to the bit line shut-off voltages, voltages provided to a transistor included in the page buffer 140 in the first verification operation and the second verification operation may have different conditions.

In the second verification operation, the conditions of a voltage applied to a selected word line, the conditions of a voltage applied to an unselected word line, and the conditions of the bit line shut-off voltage may vary depending on core settings. For example, when the second verification operation is performed by a first core that is a certain core among a plurality of cores, the conditions of a voltage applied to a selected word line, the conditions of a voltage applied to an unselected word line, and the conditions of a bit line shut-off voltage, by the first core, may be adjusted.

In operation S40, the memory device may detect fail cells by determining if memory cells have been overprogrammed. A detailed example of operation S40 will be described below with reference to FIGS. 10A, 11A, and 12A.

In operation S50, the memory device may determine whether the number of detected fail cells is greater than or equal to a reference value. The reference value may be a preset value, or may be set considering an error range.

When the number of detected fail cells is greater than or equal to the reference value, the memory device may set one or more fail flags for the fail cells in operation S60. The fail flag is state information about a fail cell and may be stored in the memory device.

In addition, when the number of detected fail cells is greater than or equal to the reference value, the memory device may terminate the program operation in operation S60. The memory device may terminate the program operation on a memory region including the fail cells, such as the page including the fail cells or a memory block including the fail cells. The memory device may program, to another memory region (e.g., another page or another memory block), data that was to be programmed to the corresponding memory region. In some examples, a redundant page may be used in place of the page including the fail cells based on the fail flag (when the number of fail cells is greater than or equal to the reference value). In some examples, based on a fail flag (when the number of fail cells is greater than or equal to the reference value), a memory block including a fail cell may be managed as a bad block, and information about the bad block may be stored in the memory device.

When a command to extract state information of the memory device 100 has been received from an external source (e.g., the memory controller 200 of FIG. 1), the memory device may transmit state information corresponding to the fail flag to the external source in response to the command.

When the number of detected fail cells is not greater than or equal to the reference value, the memory device may perform a program operation for a subsequent program state in operation S70. That is, when the number of detected fail cells is less than the reference value, the memory device may perform the program operation for the subsequent program state in operation S70 by restarting the method of FIG. 9A (at S10) for the subsequent program state as the new target program state. The subsequent program state may be a higher program state than the previous target program state.

Referring to FIGS. 9A and 9B, when it is determined that the first verification operation for the target program state has been passed by performing operation S30, the memory device may determine whether the target program state is the highest program state in operation S31. When the target program state is not the highest program state, the memory device may perform the second verification operation of detecting a fail cell (i.e., operation S40).

On the contrary, when the target program state is the highest program state, the program operation may be completed (i.e., operation S35). When the target program state is the highest program state, even though it is possible that some of the memory cells have been overprogrammed, the probability that the memory cell is read as another program state in a data read operation is low, and thus, the second verification operation of detecting a fail cell may not be performed. For example, as described above with reference to FIG. 6, when the memory cell is a TLC and the target program state is the seventh program state P7, which is the highest program state, the program operation may be completed without performing the second verification operation.

For example, when the memory cell is an MLC and the target program state is the third program state P3, which is the highest program state, the program operation may be completed without performing the second verification operation. When the memory cell is a QLC and the target program state is a fifteenth program state P15, which is the highest program state, the program operation may be completed without performing the second verification operation.

The memory device of the inventive concept may detect an overprogrammed fail cell by using an over-bit detect voltage in a program operation. The memory device may manage a fail cell by storing a fail flag(s), which is state information about detected fail cell(s), and store data in another memory region instead of the fail cell. Accordingly, the reliability of the memory device may be improved by detecting and managing a fail cell in advance when performing a program operation.

Figure 10A:
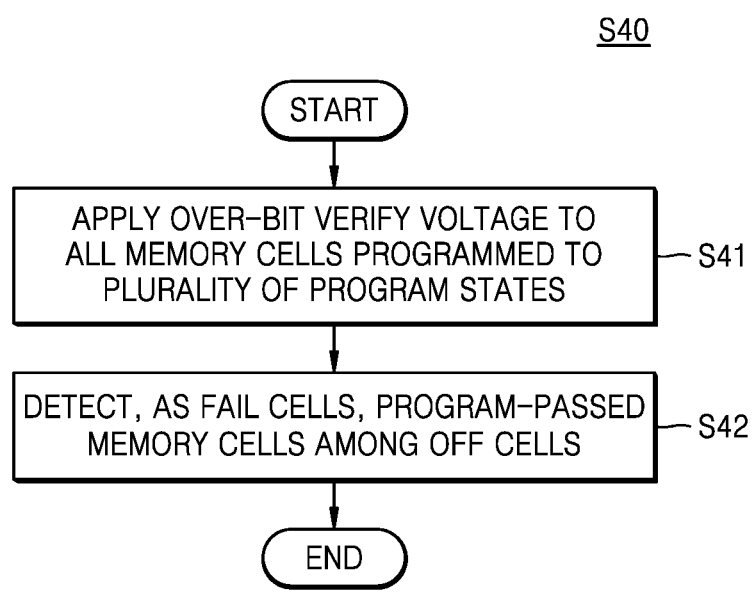
FIG. 10A is a flowchart for describing an operation method of a memory device according to an embodiment of the inventive concept.
Figure 10B:
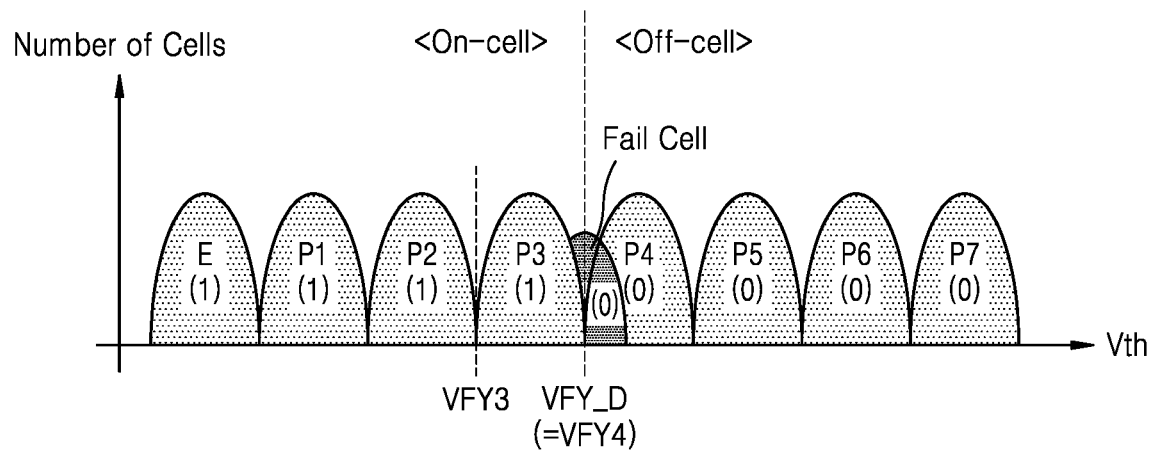
FIG. 10B is a diagram for describing the operation method of the memory device of FIG. 10A.

FIG. 10A is a flowchart for describing an operation method of a memory device according to an embodiment of the inventive concept, and FIG. 10B is a diagram for describing the operation method of the memory device of FIG. 10A. Operation S40 illustrated in FIG. 10A is an example of operation S40 of FIG. 9A, and includes operations S41 and S42. As described below, some example, operation S40 of FIG. 10A may occur in a different sequence as compared to that shown in FIG. 9A, such as after programming to all program states has occurred with respect to memory cells of a word line WL.

Referring to FIGS. 10A and 10B, in operation S41, the memory device may apply an over-bit verify voltage to all memory cells connected to a selected word line WL. For example, after programming selected memory cells of a selected word line WL to the third program state P3 (and verifying the same with a normal verify operation), in order to detect fail cells of memory cells programmed to the third program state P3, an over-bit verify voltage VFY_D may be applied to the selected word line and all memory cells having a target state of the erase state E and the first to seventh program states P1 to P7 of the selected word line may be sensed and read. In an embodiment, the over-bit verify voltage VFY_D may be the fourth verify voltage VFY4 corresponding to the fourth program state P4 that is the subsequent program state after the third program state P3 that is the target program state with respect to the over-bit verification.

In operation S42, the memory device may detect fail cells as being those memory cells identified as the program-passed memory cell among off cells from the sense and read of the memory cells in operation S41. For example, memory cells intended to be programmed to the target program state (e.g., third program state P3) may be overprogrammed to have a threshold voltage higher than the target program state - higher than the upper threshold voltage of the target program state range (e.g., a threshold voltage corresponding to the fourth program state P4 when the third program state P3 is the target program state). These off cells may be identified as overprogrammed cells (and thus detected as fail cells), where an off cell is a memory cell transistor (of the memory cells) that is not turned on with the application of the over-bit verify voltage (e.g., VFY_D) as a result of the threshold voltage of that memory cell transistor being too high. In some examples, the memory device may mask memory cells that have not yet been programmed to a program state higher than the target program state associated with the over-bit verify operation among all the off cells having threshold voltages higher than the over-bit verify voltage, to detect, as fail cells, the program-passed memory cells (i.e., pass cells) among the off cells.

For example, when detecting fail cells among memory cells programmed to the third program state P3, program operations for the first to third program states P1 to P3 may have been completed, and program operations for the fourth to seventh program states P4 to P7 may not be completed yet. Accordingly, the memory device may select program-passed memory cells by excluding memory cells for which program operations is not completed from among off cells detected after applying the over-bit verify voltage VFY_D, and detect the selected memory cells as fail cells.

Figure 11A:
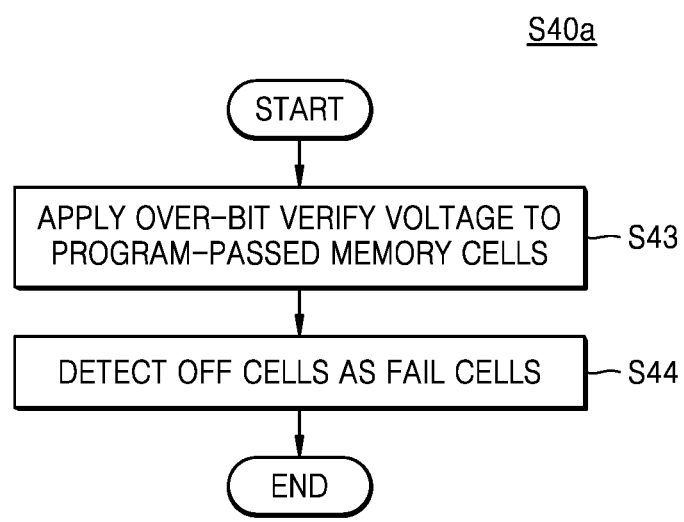
FIG. 11A is a flowchart for describing an operation method of a memory device according to an embodiment of the inventive concept.
Figure 11B:
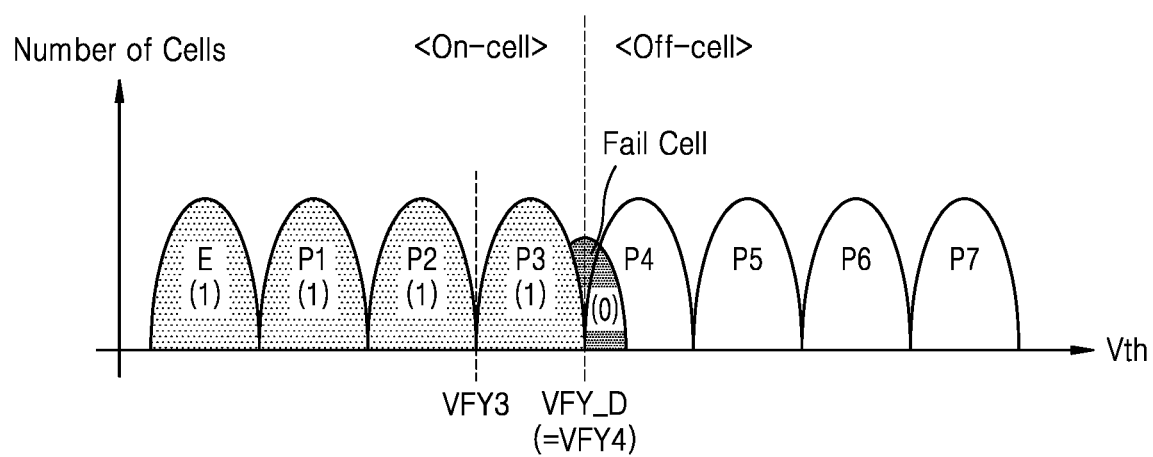
FIG. 11B is a diagram for describing the operation method of the memory device of FIG. 11A.

FIG. 11A is a flowchart for describing an operation method of a memory device according to an embodiment of the inventive concept, and FIG. 11B is a diagram for describing the operation method of the memory device of FIG. 11A. Operation S40a illustrated in FIG. 11A is an example of operation S40 of FIG. 9A, and includes operations S43 and S44.

Referring to FIGS. 11A and 11B, in operation S43, the memory device may apply an over-bit verify voltage to sense and read program-passed memory cells of the selected word line WL. For example, in order to detect a fail cell of memory cells program-passed for the third program state P3, the over-bit verify voltage VFY_D may be applied to the selected word line and memory cells program-passed for the first to third program states P1 to P3 may be sensed and read. In an embodiment, the over-bit verify voltage VFY_D may be the fourth verify voltage VFY4 corresponding to the fourth program state P4 that is the subsequent program state after the third program state P3 that is the target program state.

In operation S44, the memory device may detect off cells as fail cells. For example, based on the over-bit verify voltage VFY_D, the memory device may detect on cells having lower threshold voltages than the over-bit verify voltage VFY_D. The memory device may detect, as fail cells, off cells detected by masking the on cells among program-passed cells corresponding to the target program state of the over-bit verify operation or lower (i.e., all program-passed cells for P1 to P3 and all erase state E cells that were not on cells may be determined to be off cells and thus detected as fail cells). When detecting fail cells among memory cells programmed to the third program state P3, program operations for the first to third program states P1 to P3 may have been completed. Off cells may be detected, as fail cells, by excluding on cells from among program-passed cells programmed to the first to third program states P1 to P3 and excluding cells having the erase state E.

Figure 12A:
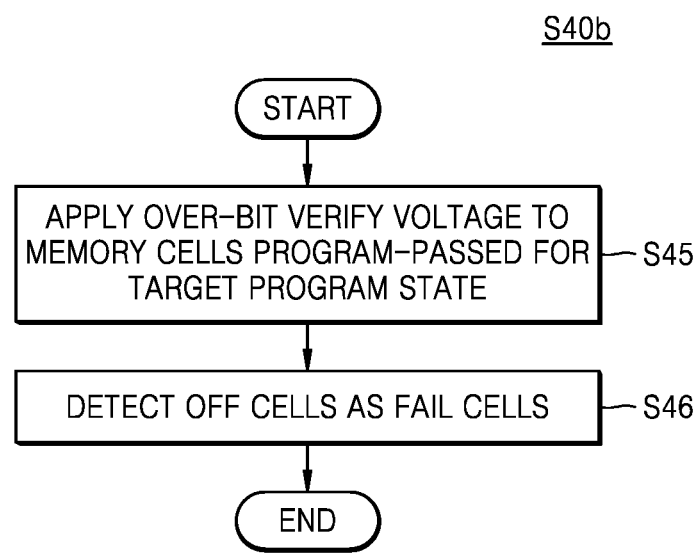
FIG. 12A is a flowchart for describing an operation method of a memory device according to an embodiment of the inventive concept.
Figure 12B:
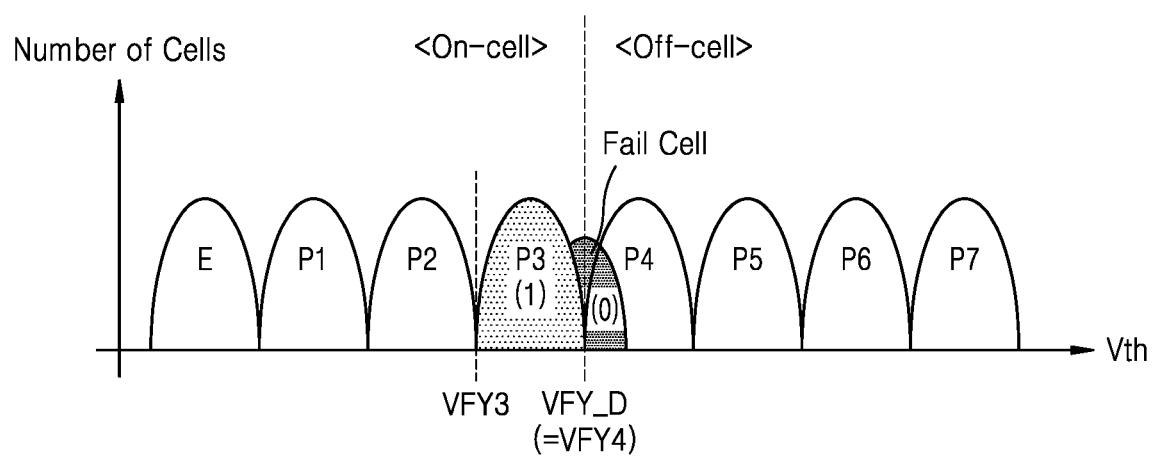
FIG. 12B is a diagram for describing the operation method of the memory device of FIG. 12A.

FIG. 12A is a flowchart for describing an operation method of a memory device according to an embodiment of the inventive concept, and FIG. 12B is a diagram for describing the operation method of the memory device of FIG. 12A. Operation S40b illustrated in FIG. 12A may be an example of operation S40 of FIG. 9A, and may include operations S45 and S46.

Referring to FIGS. 12A and 12B, in operation S45, the memory device may apply an over-bit verify voltage to the selected word line and sense and read the selected memory cells program-passed for the target program state associated with the over-bit verify operation. That is, the memory device may apply the over-bit verify voltage to the program-passed memory cells to detect a fail cell. Programmed data (read from the memory cell) and data to be programmed (to the memory cell) may be stored together in a page buffer of the memory device, or program information about cells programmed before a fail cell verification operation is performed may be stored. Based on the program information, the memory device may apply the over-bit verify voltage to memory cells program-passed with respect to the target program state.

For example, in order to detect fail cells of memory cells programmed to the third program state P3, the over-bit verify voltage VFY_D may be applied to a word line of selected memory cells program-passed with respect to the third program state P3, and these program-passed memory cells may be sensed and read. In an embodiment, the over-bit verify voltage VFY_D may be the fourth verify voltage VFY4 corresponding to the fourth program state P4 that is the subsequent program state after the third program state P3 that is the target program state.

In operation S46, the memory device may detect off cells and identify the same as detected fail cells. For example, when detecting fail cells among memory cells programmed to the third program state P3, off cells may be those memory cells having threshold voltages greater than the over-bit verify voltage VFY_D among pass cells in the third program state P3 and may be detected as fail cells.

Figure 13:
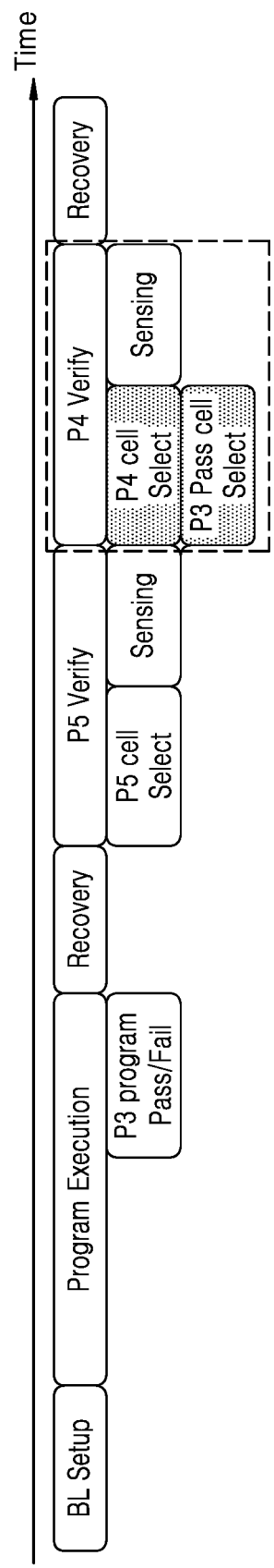
FIG. 13 is a diagram for describing operations of a memory device in time series, according to an embodiment.

FIG. 13 is a diagram for describing operations of a memory device in time series, according to an embodiment. An operation of detecting fail cells among memory cells having the third program state P3 as a target program state will be described as an example with reference to FIG. 13.

Referring to FIG. 13, the memory device may set up the bit lines BL. That is, the memory device may distinguish first bit lines (selected bit lines), which are connected to memory cells to be programmed (selected memory cells), from second bit lines (unselected bit lines), which are connected to memory cells not to be programmed.

When the bit lines BL are set, the memory device may perform a program. The memory device may perform the program by applying a bit line program voltage to the first bit lines, a bit line inhibit voltage to the second bit lines, and a program pulse to word lines. In this case, the bit line inhibit voltage may have a higher voltage level than that of the bit line program voltage. The bit line inhibit voltage may cause the corresponding bit line connected to an unselected memory cell to float (and allowed to increase in voltage with the program pulse) and thus provide a relatively lower voltage across the unselected memory cell transistor between its channel and gate such that charge is not injected into the charge storage element of the unselected memory cell transistor. However, the bit line program voltage may cause the corresponding bit line connected to a selected memory cell to be connected to allow the bit line to drain charge and maintain a lower voltage to provide a relatively higher voltage across the selected memory cell transistor to cause charge to be injected into the charge storage element of the selected memory cell transistor.

The memory device may determine whether a program operation for the third program state P3 is passed or failed, while performing the program. For example, before performing the operation of setting up the bit lines BL, a verification operation for the third program state P3 may be performed, and the memory device may determine whether the program operation for the third program state P3 is passed or failed according to a result of performing this verification operation while performing the program. After performing the program, the memory device may perform a recovery for a subsequent operation.

Following the recovery, the memory device may perform a verification operation for program states higher than the third program state P3. In an embodiment, a verification operation for a relatively high program state may be preferentially performed. For example, after a verification operation for the fifth program state P5 is performed, a verification operation for the fourth program state P4 may be performed. However, the inventive concept is not limited thereto, and unlike as illustrated in FIG. 13, a verification operation for a relatively low program state may be preferentially performed.

In order to perform the verification operation for the fifth program state P5, the memory device may select a P5 cell having the fifth program state P5 as a target program state, and apply a fifth verify voltage (e.g., VFY5 of FIG. 6) to the word line of the P5 cell. The memory device may sense the P5 cell while applying the fifth verify voltage VFY5 to the word line of the P5 cell. A general sensing operation for a memory cell may include a bit line precharge operation and a bit line sensing operation.

When the verification operation for the fifth program state P5 is completed, in order to perform a verification operation for the fourth program state P4, the memory device may select a P4 cell having the fourth program state P4 as a target program state. Also, the memory device may parallelly perform a fail cell verification operation for pass cells (P3 pass cells) of the third program state P3 while performing the verification operation for the fourth program state P4 (of P4 cells). For example, the memory device may perform an operation of selecting P4 cells in parallel with an operation of selecting P3 pass cells.

The memory device may apply a fourth verify voltage (e.g., VFY4 of FIG. 6) to word line(s) of the P4 cells and the P3 pass cells. For example, while the fourth verify voltage VFY4 is applied to a word line having of the P4 cells (memory cells being programmed to the P4 program state) and the P3 pass cells (memory cells previously programmed to the P3 program state and verified as having reached the P3 program state), the P4 cells and the P3 pass cells may be sensed together with results of the sensing (e.g. if the cell is an on cell or off cell) being stored (latched) by the page buffer connected to the P4 cells and P3 pass cells. The fourth verify voltage VFY4 may be used as an over-bit verify voltage (e.g., VFY_D of FIG. 6) of the third program state P3 while also being used as a program verify of the P4 cells (to confirm programming of the P4 cells to at least the lower range of the P4 program state). It will be appreciated that reference to being programmed to a target program state as used herein may include both memory cells programmed to fall within the range of the target program state and over-programmed fail cells programmed past the range of the target program state.

However, unlike as illustrated in FIG. 13, when the over-bit verify voltage VFY_D of the third program state P3 is different from the fourth verify voltage VFY4, the memory device may perform a fail cell verification operation on the P3 pass cells separately from the verification operation for the fourth program state P4, and for example, may perform a fail cell verification operation on the P3 pass cells before verification operations for the fourth and fifth program states P4 and P5.

After performing the verification operations for the fourth and fifth program states P4 and P5, the memory device may perform recovery for a subsequent operation. The series of operations described above with reference to FIG. 13 may be similarly applied to fail cell verification operations for other program states than the third program state P3. Accordingly, the series of operations described above with reference to FIG. 13 may be repeatedly performed with respect to a plurality of program states.

Figure 14:
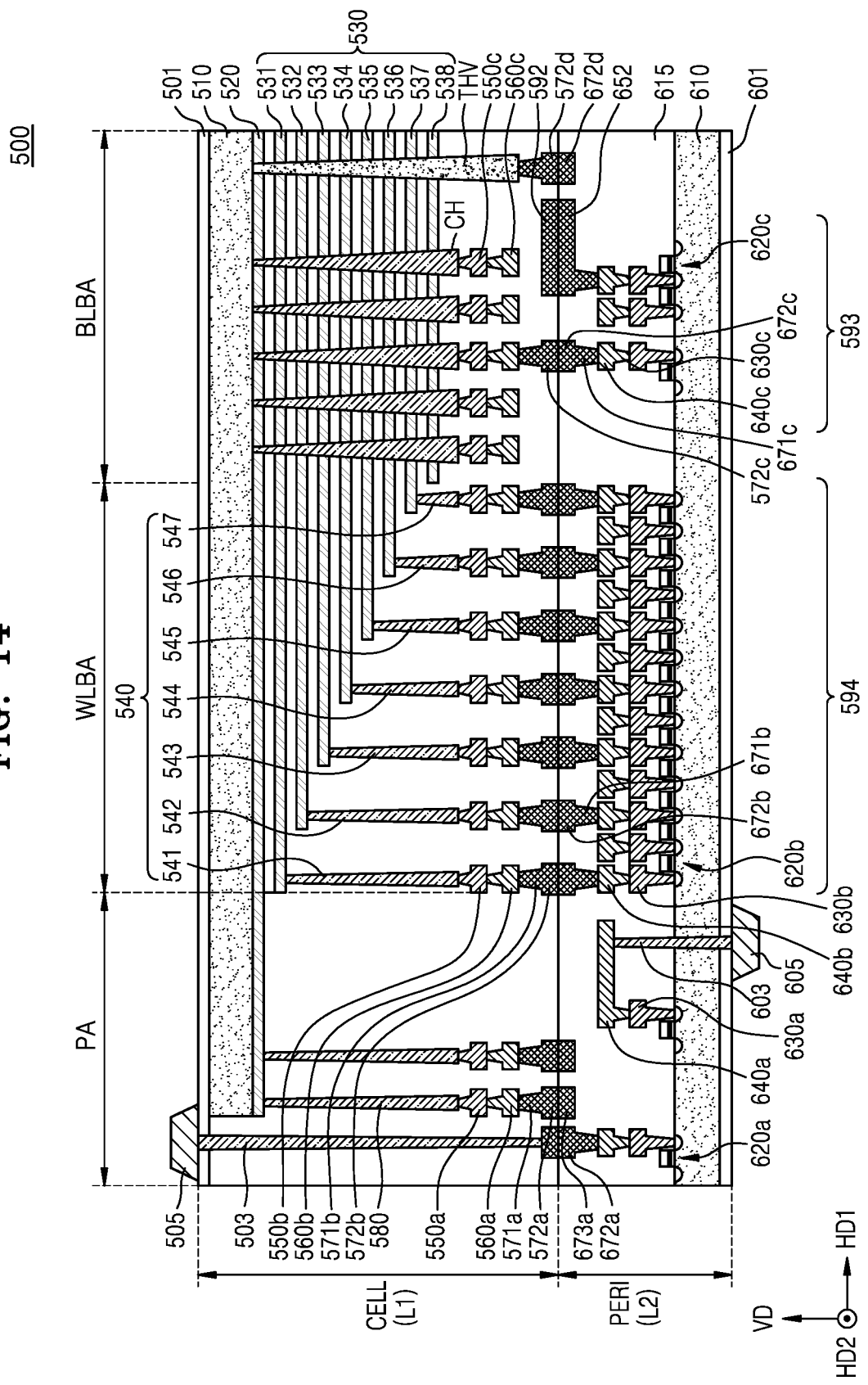
FIG. 14 is a cross-sectional view of a memory device having a bonding-vertical-NAND (B-VNAND) structure according to an embodiment.

FIG. 14 is a cross-sectional view of a memory device 500 having a B-VNAND structure according to an embodiment. When a nonvolatile memory included in a memory device is implemented as B-VNAND-type flash memory, the nonvolatile memory may have the structure illustrated in FIG. 14.

Referring to FIG. 14, a cell region CELL of the memory device 500 may correspond to the first semiconductor layer L1, and a peripheral circuit region PERI may correspond to the second semiconductor layer L2. Each of the peripheral circuit region PERI and the cell region CELL of the memory device 500 may include an external pad bonding region PA, a word line bonding region WLBA, and a bit line bonding region BLBA.

The peripheral circuit region PERI may include a first substrate 610, an interlayer insulating layer 615, a plurality of circuit elements 620a, 620b, and 620c formed on the first substrate 610, first metal layers 630a, 630b, and 630c respectively connected to the plurality of circuit elements 620a, 620b, and 620c, and second metal layers 640a, 640b, and 640c respectively formed on the first metal layers 630a, 630b, and 630c. The first substrate 610 may be a crystalline semiconductor substrate, such as a bulk substrate formed of crystalline Si, SiGe or Ge. In an embodiment, the first metal layers 630a, 630b, and 630c may be formed of tungsten having a relatively high resistance, and the second metal layers 640a, 640b, and 640c may be formed of copper having a relatively low resistance.

In the present specification, only the first metal layers 630a, 630b, and 630c and the second metal layers 640a, 640b, and 640c are illustrated, but the inventive concept is not limited thereto, and one or more metal layers may be further formed on the second metal layers 640a, 640b, and 640c. At least some of the one or more metal layers formed on the second metal layers 640a, 640b, and 640c may be formed of aluminum or the like having a lower resistance than that of copper forming the second metal layers 640a, 640b, and 640c.

The interlayer insulating layer 615 may be arranged on the first substrate 610 to cover the plurality of circuit elements 620a, 620b, and 620c, the first metal layers 630a, 630b, and 630c, and the second metal layers 640a, 640b, and 640c, and may include an insulating material, such as silicon oxide or silicon nitride.

Lower bonding metals 671b and 672b may be formed on the second metal layer 640b of the word line bonding region WLBA. In the word line bonding region WLBA, the lower bonding metals 671b and 672b of the peripheral circuit region PERI may be electrically connected to upper bonding metals 571b and 572b of the cell region CELL by a bonding method, and the lower bonding metals 671b and 672b and the upper bonding metals 571b and 572b may be formed of aluminum, copper, tungsten, or the like.

The cell region CELL may provide at least one memory block. The cell region CELL may include a second substrate 510 and a common source line 520. The second substate 510 may be a crystalline semiconductor substrate, such as a bulk substrate formed of crystalline Si, SiGe or Ge. On the second substrate 510, a plurality of word lines 530 or 531 to 538 may be stacked in the vertical direction VD perpendicular to the top surface of the second substrate 510. String select lines and ground select lines may be arranged in upper and lower portions of the word lines 530, respectively, and the plurality of word lines 530 may be arranged between the string select lines and the ground select line.

In the bit line bonding region BLBA, a channel structure CH may extend in a vertical direction VD perpendicular to the top surface of the second substrate 510 to penetrate the word lines 530, the string select lines, and the ground select lines. The channel structure CH may include a data storage layer, a channel layer, a buried insulating layer, and the like, and the channel layer may be electrically connected to a first metal layer 550c and a second metal layer 560c. For example, the first metal layer 550c may be a bit line contact, and the second metal layer 560c may be a bit line. In an embodiment, the bit line 560c may extend in the second horizontal direction HD2 parallel to the top surface of the second substrate 510.

In an embodiment, a region in which the channel structure CH and the bit line 560c are arranged may be defined as the bit line bonding region BLBA. The bit line 560c may be electrically connected to the circuit elements 620c that provide a page buffer 593 of the peripheral circuit region PERI in the bit line bonding region BLBA. For example, the bit line 560c may be connected to upper bonding metals 571c and 572c of the cell region CELL, and the upper bonding metals 571c and 572c may be connected to lower bonding metals 671c and 672c connected to the circuit elements 620c of the page buffer 593. Accordingly, the page buffer 593 may be connected to the bit line 560c through the bonding metals 571c, 572c, 671c, and 672c.

In an embodiment, the memory device 500 may further include a through electrode THV arranged in the bit line bonding region BLBA. The through electrode THV may extend in the vertical direction VD through the word lines 530. The through electrode THV may be connected to the common source line 520 and/or to the second substrate 510, which is an upper substrate. Although not illustrated, an insulating ring may be arranged around the through electrode THV, and the through electrode THV may be insulated from the word lines 530. The through electrode THV may be connected to the peripheral circuit region PERI through an upper bonding metal 572d and a lower bonding metal 672d.

In the word line bonding region WLBA, the word lines 530 may extend in the first horizontal direction HD1 parallel to the top surface of the second substrate 510, and may be connected to a plurality of cell contact plugs 540 or 541 to 547. The word lines 530 may be connected to the cell contact plugs 540, respectively, through pads provided by at least some of the word lines 530 extending in the vertical direction VD to have different lengths. A first metal layer 550b and a second metal layer 560b may be sequentially connected to upper portions of the cell contact plugs 540 connected to the word lines 530. In the word line bonding region WLBA, the cell contact plugs 540 may be connected to the peripheral circuit region PERI through the upper bonding metals 571b and 572b of the cell region CELL and the lower bonding metals 671b and 672b of the peripheral circuit region PERI.

The cell contact plugs 540 may be electrically connected to the circuit elements 620b that provides a row decoder 594 in the peripheral circuit region PERI. In an embodiment, operating voltages of the circuit elements 620b providing the row decoder 594 may be different from the operating voltages of the circuit elements 620c providing the page buffer 593. For example, the operating voltages of the circuit elements 620c providing the page buffer 593 may be greater than the operating voltages of the circuit elements 620b providing the row decoder 594.

A common source line contact plug 580 may be arranged in the external pad bonding region PA. The common source line contact plug 580 may be formed of a metal, a metal compound, or a conductive material such as polysilicon, and may be electrically connected to the common source line 520. A first metal layer 550a and a second metal layer 560a may be sequentially stacked on the common source line contact plug 580. For example, a region in which the common source line contact plug 580, the first metal layer 550a, and the second metal layer 560a are arranged may be defined as the external pad bonding region PA.

Meanwhile, input/output pads 505 and 605 (hereinafter, also referred to as the first and second input/output pads 605 and 505) may be arranged in the external pad bonding region PA. A lower insulating layer 601 covering the bottom surface of the first substrate 610 may be formed under the first substrate 610, and the first input/output pad 605 may be formed on the lower insulating layer 601. The first input/output pad 605 may be connected to at least one of the plurality of circuit elements 620a, 620b, and 620c arranged in the peripheral circuit region PERI, through a first input/output contact plug 603, and may be separated from the first substrate 610 by the lower insulating layer 601. In addition, a side insulating layer may be arranged between the first input/output contact plug 603 and the first substrate 610 to electrically separate the first input/output contact plug 603 from the first substrate 610.

An upper insulating layer 501 covering the top surface of the second substrate 510 may be formed on the second substrate 510, and second input/output pad 505 may be arranged on the upper insulating layer 501. The second input/output pad 505 may be connected to at least one of the plurality of circuit elements 620a, 620b, and 620c arranged in the peripheral circuit region PERI, through a second input/output contact plug 503.

In some embodiments, the second substrate 510, the common source line 520, and the like may not be arranged in the region in which the second input/output contact plug 503 is arranged. In addition, the second input/output pad 505 may not overlap the word lines 530 in a vertical direction VD. The second input/output contact plug 503 may be separated from the second substrate 510 in a direction parallel to the top surface of the second substrate 510, and may penetrate the interlayer insulating layer of the cell region CELL to be connected to the second input/output pad 505.

In some embodiments, the first input/output pad 605 and the second input/output pad 505 may be selectively formed. For example, the memory device 500 may include only the first input/output pad 605 arranged on the first substrate 610, or may include only the second input/output pad 505 arranged on the second substrate 510. Alternatively, the memory device 500 may include both the first input/output pad 605 and the second input/output pad 505.

In each of the external pad bonding region PA and the bit line bonding region BLBA included in the cell region CELL and the peripheral circuit region PERI, respectively, a metal pattern of the uppermost metal layer may exist as a dummy pattern, or the uppermost metal layer may be empty.

In the external pad bonding region PA of the memory device 500, a lower metal pattern 673a having the same shape as that of an upper metal pattern 572a may be formed in the uppermost metal layer of the peripheral circuit region PERI to correspond to the upper metal pattern 572a formed in the uppermost metal layer of the cell region CELL. The lower metal pattern 673a formed on the uppermost metal layer of the peripheral circuit region PERI may not be connected to a separate contact in the peripheral circuit region PERI. Similarly, in the external pad bonding region PA, an upper metal pattern having the same shape as that of the lower metal pattern of the peripheral circuit region PERI may be formed in the upper metal layer of the cell region CELL to correspond to the lower metal pattern formed in the uppermost metal layer of the peripheral circuit region PERI.

Lower bonding metals 671b and 672b may be formed on the second metal layer 640b of the word line bonding region WLBA. In the word line bonding region WLBA, the lower bonding metals 671b and 672b of the peripheral circuit region PERI may be electrically connected to upper bonding metals 571b and 572b of the cell region CELL by a bonding method.

In addition, in the bit line bonding region BLBA, an upper metal pattern 592 having the same shape as that of a lower metal pattern 652 may be formed in the uppermost metal layer of the cell region CELL to correspond to the lower metal pattern 652 formed in the uppermost metal layer of the peripheral circuit region PERI. Any contact may not be formed on the upper metal pattern 592 formed in the uppermost metal layer of the cell region CELL.

Figure 15:
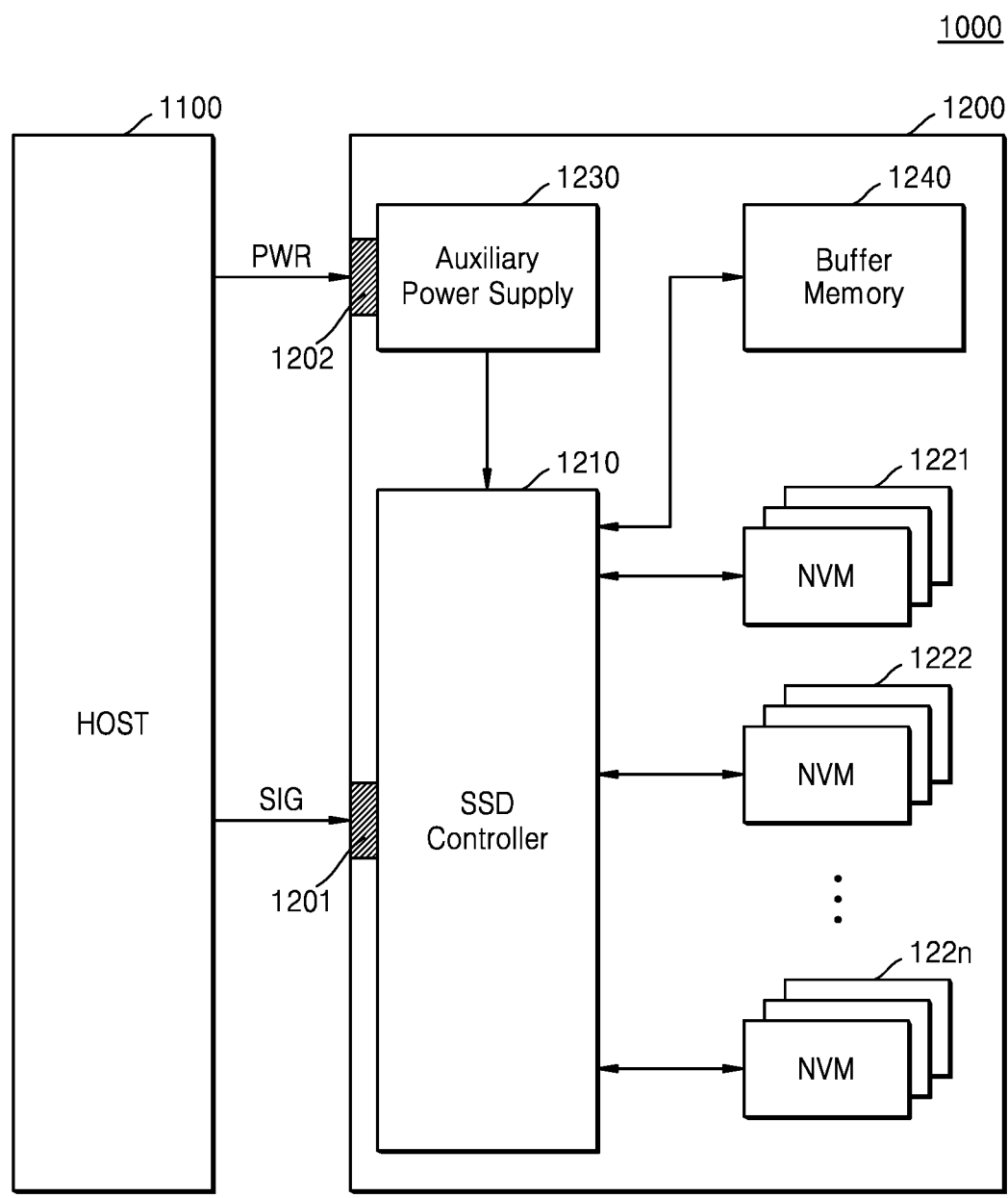
FIG. 15 is a block diagram illustrating a solid-state drive (SSD) system according to an embodiment.

FIG. 15 is a block diagram illustrating an SSD system 1000 according to an embodiment of the invention. Referring to FIG. 15, the SSD system 1000 may include a host 1100 and an SSD 1200. The SSD 1200 transmits and receives signals to and from the host 1100 through a signal connector, and receives power through a power connector. The SSD 1200 may include an SSD controller 1210, an auxiliary power supply 1230, and memory devices (NVM) 1221, 1222, and 122n and buffer memory 1240. The memory devices 1221, 1222, and 122n may be vertically stacked NAND flash memory devices. In this case, each of the memory devices 1221, 1222, and 122n of the SSD 1200 may be implemented by the embodiments of the memory device described above with reference to FIGS. 1 to 13.

As described above, the memory device may detect an overprogrammed fail cell by using an over-bit detect voltage in a program operation. The memory device may manage a fail cell by storing a flag, which is state information about the detected fail cell, and store data in another memory region instead of the fail cell. Accordingly, the reliability of the memory device may be improved by detecting and managing a fail cell in advance when performing a program operation.

While the inventive concept has been particularly shown and described with reference to embodiments thereof, it will be understood that various changes in form and details may be made therein without departing from the spirit and scope of the following claims.

What is claimed is:

1. A method of programming memory cells of a memory device to a plurality of program states, the method comprising, for a target program state of the plurality of program states:
    (a) selecting one or more of the memory cells to be programmed to the target program state, the selected memory cells being connected to a selected word line;
    (b) applying one or more program pulses to the selected memory cells;
    (c) performing a first verification operation of verifying the selected memory cells as programmed to at least the target program state, the verified selected memory cells being identified as programmed-passed memory cells, the first verification operation comprising providing a first verify voltage to the selected memory cells;
    (d) after the first verification operation is passed for all of the selected memory cells, performing a second verification operation of detecting fail cells among the programmed-passed memory cells, the second verification operation comprising providing an over-bit verify voltage to the programmed-passed memory cells; and
    (e) comparing a number of detected fail cells to a reference value to determine whether a program operation should be terminated,
    wherein the over-bit verify voltage provided to the programmed-passed memory cells in the second verification operation comprises a verify voltage corresponding to a subsequent program state to the target program state,
    wherein a first voltage is applied to an unselected word line during the first verification operation,
    wherein a second voltage is applied to the unselected word line during the second verification operation, and
    wherein the first voltage and the second voltage are different from each other.

2. The method of claim 1,
    wherein memory cells connected to the selected word line include the selected memory cells and first unselected memory cells that are not selected in step (a) to be programmed to the target program state, and wherein the performing of the second verification operation includes:
    applying the over-bit verify voltage to both the first unselected memory cells and the program-passed memory cells; and
    detecting, as the fail cells, ones of the program-passed memory cells having threshold voltages greater than the over-bit verify voltage.

3. The method of claim 1, wherein the performing of the second verification operation includes:
    applying the over-bit verify voltage only to program-passed memory cells among the plurality of memory cells; and detecting, as the fail cells, program-passed memory cells having threshold voltages greater than the over-bit verify voltage.

4. The method of claim 1, wherein the performing of the second verification operation includes:
applying the over-bit verify voltage only to memory cells that are program-passed for the target program state, among the plurality of memory cells; and
detecting, as the fail cells, off cells having threshold voltages greater than the over-bit verify voltage, among the memory cells that are program-passed for the target program state.

5. The method of claim 1, wherein steps (a), (b), (c) and (d) are performed for each of the plurality of program states as the target program state except that step (d) of performing of the second verification operation is not performed for the highest program state among the plurality of program states.

6. The method of claim 1, wherein the performing of the second verification operation includes applying the over-bit verify voltage to the selected word line connected to the selected memory cells according to the target program state.

7. The method of claim 1, wherein the second verification operation is performed when applying a second verify voltage as the over-bit verify voltage, the second verify voltage corresponding to a subsequent program state and applied to verify subsequently selected memory cells have been programmed to at least the subsequent program state.

8. The method of claim 1, further comprising, in response to the number of detected fail cells being less than a reference value, performing a program operation for a subsequent program state.

9. The method of claim 1, further comprising:
setting one or more fail flags in response to detecting the fail cells; and
transmitting a state information signal corresponding to the one or more fail flags to the outside of the memory device.

10. The method of claim 1, further comprising:
setting one or more fail flags in response to detecting the fail cells; and
in response to the one or more fail flags, programming, to another memory region, data programmed to the fail cells.

11. A memory device comprising:
a memory cell array including a plurality of memory cells configured to be programmed to have a corresponding program state among a plurality of program states, each program state being defined by a corresponding range of threshold voltages;
a row decoder configured to provide a voltage to word lines of the plurality of memory cells; and
a control logic circuit configured to control the row decoder,
wherein the control logic circuit is further configured to control the row decoder to provide a program pulse to the plurality of memory cells, provide a first verify voltage to memory cells corresponding to a target program state among the plurality of program states to verify selected ones of the plurality of memory cells have been programmed to at least the target program state, and provide an over-bit verify voltage to the selected memory cells programmed to the target program state to detect fail cells,
wherein the control logic circuit is further configured to set, in response to a number of detected fail cells is greater than or equal to a reference value, one or more fail flags, and the over-bit verify voltage comprises a second verify voltage corresponding to a subsequent program state to the target program state,
wherein the memory cell array includes a plurality of word lines, and
wherein the control logic circuit is further configured to control the row decoder to provide the over-bit verify voltage to only some of the plurality of word lines and is not configured to control the row decoder to provide the over-bit verify voltage the remaining ones of the plurality of word lines.

12. The memory device of claim 11, wherein the control logic circuit includes a first core configured to perform a fail cell detection operation, and a second core configured to perform normal operations other than the fail cell detection operation.

13. The memory device of claim 11,
wherein the plurality of word lines are stacked on a substrate.

14. The memory device of claim 11,
wherein the plurality of word lines include lower word lines arranged adjacent to a substrate and upper word lines arranged above the lower word lines farther from the substrate than the lower word lines, and
wherein the control logic circuit is further configured to control the row decoder to provide the over-bit verify voltage only to the lower word lines and is not configured to control the row decoder to provide the over-bit verify voltage to the upper word lines.

15. The memory device of claim 11, further comprising a page buffer connected to bit lines of the plurality of memory cells,
wherein the page buffer is configured to store program information about the selected memory cells.

16. A method of programming memory cells of a memory device to a plurality of program states, the method comprising:
performing a first verification operation of verifying selected ones of the memory cells connected to a selected word line have been programmed to at least a target program state among the plurality of program states, the selected memory cells verified by the first verification operation being identified as program-passed memory cells;
determining whether the target program state is a highest program state among the plurality of program states; and
performing, when the target program state is a program state other than the highest program state, a second verification operation of detecting fail cells among the selected memory cells, wherein an over-bit verify voltage provided to the program-passed memory cells in the second verification operation comprises a verify voltage corresponding to a subsequent program state to the target program state,
wherein a first voltage is applied to an unselected word line during the first verification operation,
wherein a second voltage is applied to the unselected word line during the second verification operation, and
wherein the first voltage and the second voltage are different from each other.

17. The method of claim 16, further comprising terminating a program operation when the target program state is the highest program state.

18. The method of claim 16,
wherein the memory cells connected to the selected word line include the selected memory cells and first unselected memory cells that are not selected to be programmed to the target program state, and wherein the performing of the second verification operation includes:

applying the over-bit verify voltage to both the first unselected memory cells and the program-passed memory cells; and detecting, as the fail cells, ones of the program-passed memory cells having threshold voltages greater than the over-bit verify voltage.

19. The method of claim 16, wherein the performing of the second verification operation includes:

applying the over-bit verify voltage only to the memory cells identified as program-passed memory cells among the memory cells; and detecting, as the fail cells, the identified program-passed memory cells having threshold voltages greater than the over-bit verify voltage.

20. The method of claim 16, further comprising, in response to a number of fail cells being greater than or equal to a reference value, setting one or more fail flags and terminating a program operation.

* * * * *